US011437783B2

(12) United States Patent
Yamamoto et al.

(10) Patent No.: US 11,437,783 B2
(45) Date of Patent: Sep. 6, 2022

(54) SURFACE-EMITTING SEMICONDUCTOR LASER

(71) Applicant: ROHM CO., LTD., Kyoto (JP)

(72) Inventors: Masashi Yamamoto, Kyoto (JP); Yuji Tsuji, Kyoto (JP); Daiju Takamizu, Kyoto (JP); Minoru Murayama, Kyoto (JP)

(73) Assignee: ROHM CO., LTD., Kyoto (JP)

(*) Notice: Subject to any disclaimer, the term of this patent is extended or adjusted under 35 U.S.C. 154(b) by 272 days.

(21) Appl. No.: 16/644,810

(22) PCT Filed: Oct. 29, 2018

(86) PCT No.: PCT/JP2018/040185
§ 371 (c)(1),
(2) Date: Mar. 5, 2020

(87) PCT Pub. No.: WO2019/088045
PCT Pub. Date: May 9, 2019

(65) Prior Publication Data
US 2021/0075192 A1    Mar. 11, 2021

(30) Foreign Application Priority Data

Oct. 31, 2017 (JP) .............................. JP2017-210954
Oct. 4, 2018 (JP) .............................. JP2018-189369

(51) Int. Cl.
*H01S 5/183* (2006.01)
*H01S 5/028* (2006.01)
(Continued)

(52) U.S. Cl.
CPC ........ *H01S 5/18311* (2013.01); *H01S 5/0283* (2013.01); *H01S 5/0286* (2013.01);
(Continued)

(58) Field of Classification Search
CPC ..... H01S 5/183–18397; H01S 5/18391; H01S 5/18308–18338
See application file for complete search history.

(56) References Cited

U.S. PATENT DOCUMENTS 6,529,541 B1    3/2003 Ueki et al.
6,661,823 B1*  12/2003 Otoma ................ H01S 5/18391
                                                        372/49.01
(Continued)

FOREIGN PATENT DOCUMENTS

CN    1472853 A    2/2004
CN    1508915 A    6/2004
(Continued)

*Primary Examiner* — Sean P Hagan
(74) *Attorney, Agent, or Firm* — Rabin & Berdo, P.C.

(57) ABSTRACT

A surface-emitting semiconductor laser includes a first-conductivity-type layer, an active layer, and a second-conductivity-type layer. The active layer and the second-conductivity-type layer are electrically connected in a current constriction layer through an opening. The surface-emitting semiconductor laser further includes an insulating layer that has translucency with respect to an emission wavelength of the active layer, a first electrode electrically connected to the first-conductivity-type layer, and a second electrode electrically connected to the second-conductivity-type layer. In the surface-emitting semiconductor laser, a part of the insulating layer is exposed from the second electrode, and the insulating layer exposed from the second electrode includes a first portion that has a first thickness and a second portion that has a second thickness to make output of light emitted from the active layer smaller than the first portion in comparison with the first thickness and that surrounds the first portion.

19 Claims, 27 Drawing Sheets

(51) Int. Cl.
*H01S 5/042* (2006.01)
*H01S 5/343* (2006.01)
*H01S 5/42* (2006.01)
*H01S 5/024* (2006.01)

(52) U.S. Cl.
CPC ...... *H01S 5/04256* (2019.08); *H01S 5/18391* (2013.01); *H01S 5/02476* (2013.01); *H01S 5/18347* (2013.01); *H01S 5/3432* (2013.01); *H01S 5/423* (2013.01); *H01S 2301/166* (2013.01)

(56) References Cited

U.S. PATENT DOCUMENTS

| | | |
|---|---|---|
| 8,824,520 B2 | 9/2014 | Kondo et al. |
| 2003/0026308 A1* | 2/2003 | Iwai ............... H01S 5/18391 438/22 |
| 2003/0039294 A1 | 2/2003 | Ueki et al. |
| 2004/0028103 A1* | 2/2004 | Ueki ............... H01S 5/18394 372/96 |
| 2007/0014324 A1* | 1/2007 | Maeda ............ H01S 5/18391 372/45.01 |
| 2011/0115872 A1* | 5/2011 | Harasaka ........ G02B 26/124 372/45.01 |
| 2011/0135318 A1* | 6/2011 | Takeda ........... H01S 5/18311 |
| 2011/0165712 A1 | 7/2011 | Uchida |
| 2012/0057902 A1 | 3/2012 | Shouji et al. |
| 2012/0114005 A1* | 5/2012 | Inao ............... H01S 5/18313 257/E21.085 |
| 2013/0070039 A1* | 3/2013 | Harasaka ........ B41J 2/471 372/50.12 |
| 2013/0188659 A1* | 7/2013 | Kondo ........... H01S 5/18394 372/24 |
| 2014/0112364 A1 | 4/2014 | Kondo et al. |
| 2014/0130975 A1 | 5/2014 | Shouji et al. |
| 2016/0134083 A1 | 5/2016 | Dallesasse et al. |
| 2018/0041010 A1 | 2/2018 | Dallesasse et al. |

FOREIGN PATENT DOCUMENTS

| | | |
|---|---|---|
| CN | 102439806 A | 5/2012 |
| JP | 2002-208755 A | 7/2002 |
| JP | 2006-237648 A | 9/2006 |
| JP | 2011-009693 A | 1/2011 |
| JP | 2011-119370 A | 6/2011 |
| JP | 2011-159962 A | 8/2011 |
| JP | 2012-195510 A | 10/2012 |
| JP | 2013-058687 A | 3/2013 |
| JP | 2013-175712 A | 9/2013 |
| JP | 2014-022690 A | 2/2014 |
| JP | 2014-086565 A | 5/2014 |
| JP | 2017-157742 A | 9/2017 |

* cited by examiner

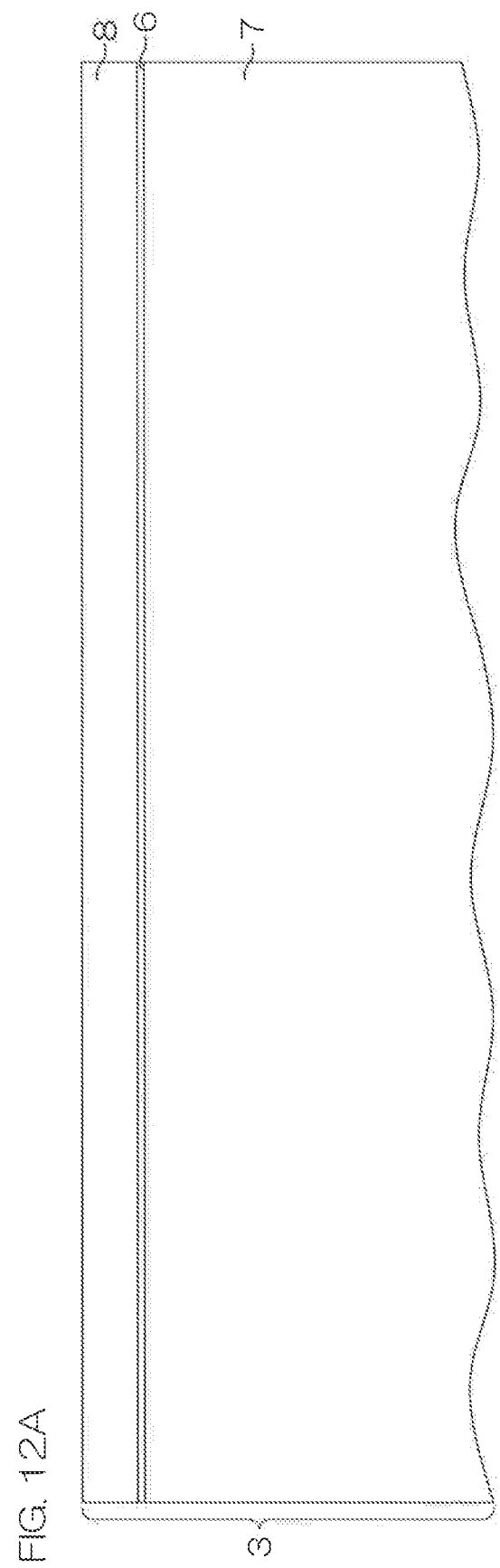

SURFACE-EMITTING SEMICONDUCTOR LASER

TECHNICAL FIELD

The present invention relates to a surface-emitting semiconductor laser.

BACKGROUND ART

A surface-emitting semiconductor laser has been known in which the resonance direction of light is perpendicular to a substrate surface.

For example, Patent Literature 1 discloses a surface-emitting semiconductor laser that includes an n type GaAs substrate, an n type multilayer-film Bragg reflection layer on the n type GaAs substrate, an n type AlGaAs cladding layer on the n type multilayer-film Bragg reflection layer, a multi quantum well active layer on the n type AlGaAs cladding layer, a p type AlGaAs cladding layer on the multi quantum well active layer, a p type AlAs selective oxidation layer disposed at a place between both ends of the p type AlGaAs cladding layer, a p type multilayer-film Bragg reflection layer on the p type AlGaAs cladding layer, a p type GaAs contact layer on the p type multilayer-film Bragg reflection layer, a p-side electrode formed on a surface of the p type GaAs contact layer, and an n-side electrode formed on a rear surface of the substrate.

CITATION LIST

Patent Literature

Patent Literature 1: Japanese Patent Application Publication No. 2014-22690

SUMMARY OF INVENTION

Technical Problem

In a conventional surface-emitting semiconductor laser, light in an oblique direction (higher-order mode) is generated in accordance with an increase in input current, and the radiation angle of light is liable to become larger. Therefore, it is difficult to make an optical design, and optical output is limited when the semiconductor laser is used for a sensor, such as a distance measuring sensor.

Therefore, an object of the present invention is to provide a surface-emitting semiconductor laser that is capable of outputting laser light having a higher directivity.

Solution to Problem

A surface-emitting semiconductor laser according to one preferred embodiment of the present invention includes a semiconductor laminated structure that includes a first-conductivity-type layer, an active layer stacked on the first-conductivity-type layer, and a second-conductivity-type layer stacked on the active layer and in which light generated in the active layer is extracted as laser light from a side of the second-conductivity-type layer while resonating along a lamination direction of these layers, a current constriction layer that is formed closer to a side of the active layer than a surface of the second-conductivity-type layer on the active layer, and that is an insulative current constriction layer having an opening, and in which the active layer and the second-conductivity-type layer are electrically connected together through the opening, an insulating layer that is formed on the second-conductivity-type layer and that has translucency with respect to an emission wavelength of the active layer, a first electrode electrically connected to the first-conductivity-type layer, and a second electrode that is formed on the insulating layer and that passes through the insulating layer and is electrically connected to the second-conductivity-type layer, wherein a part of the insulating layer is exposed from the second electrode, and the insulating layer exposed from the second electrode includes a first portion that has a first thickness and a second portion that has a second thickness to make output of light emitted from the active layer smaller than the first portion in comparison with the first thickness and that surrounds the first portion.

BRIEF DESCRIPTION OF DRAWINGS

FIG. 12A is a view showing a part of a manufacturing process of a surface-emitting semiconductor laser according to a preferred embodiment of the present invention.

DESCRIPTION OF EMBODIMENTS

Preferred embodiments of the present invention will be hereinafter described in detail with reference to the accompanying drawings.

Figure 1:
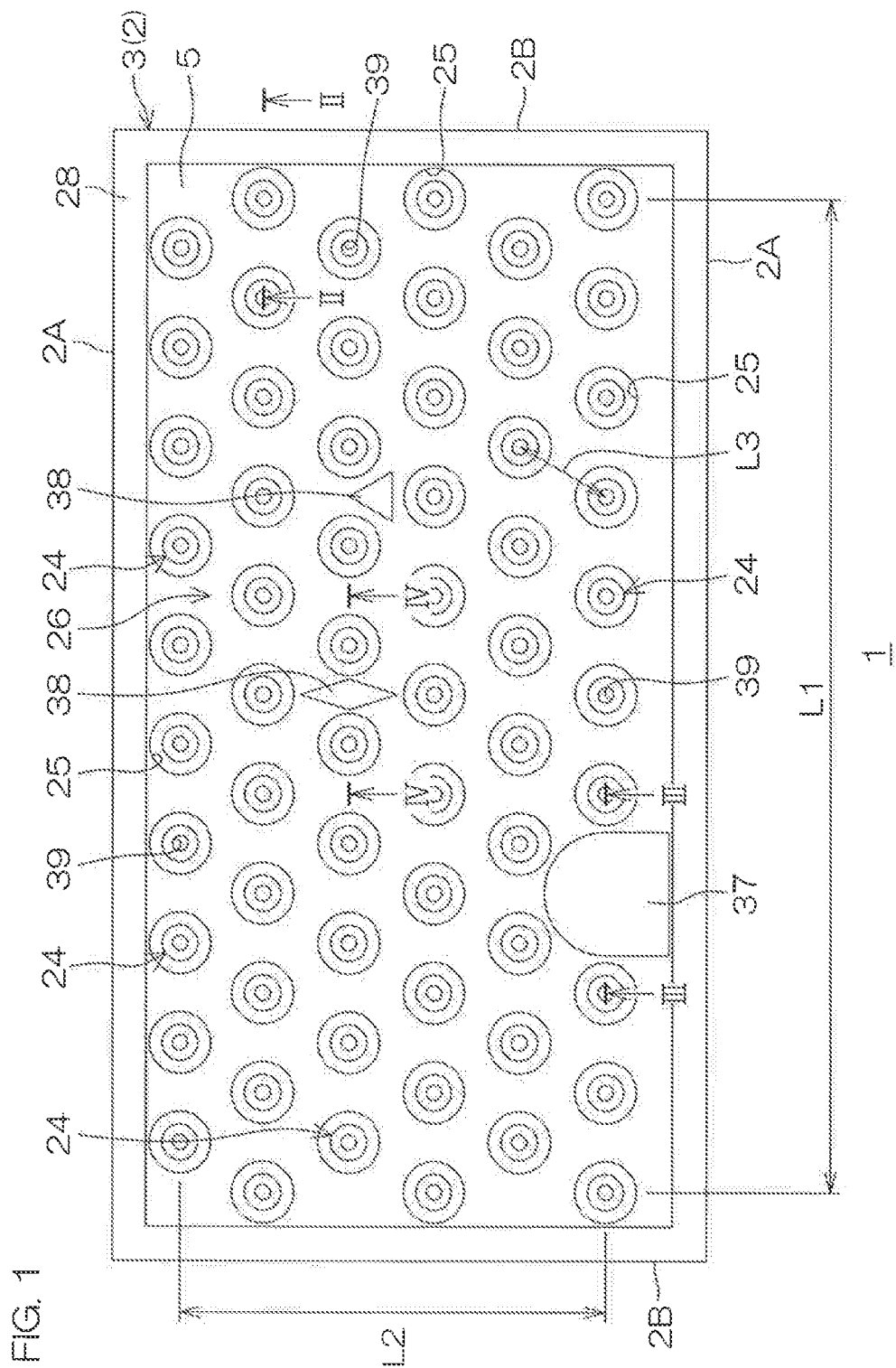
FIG. 1 is a schematic plan view of a surface-emitting semiconductor laser according to a preferred embodiment of the present invention.
Figure 2:
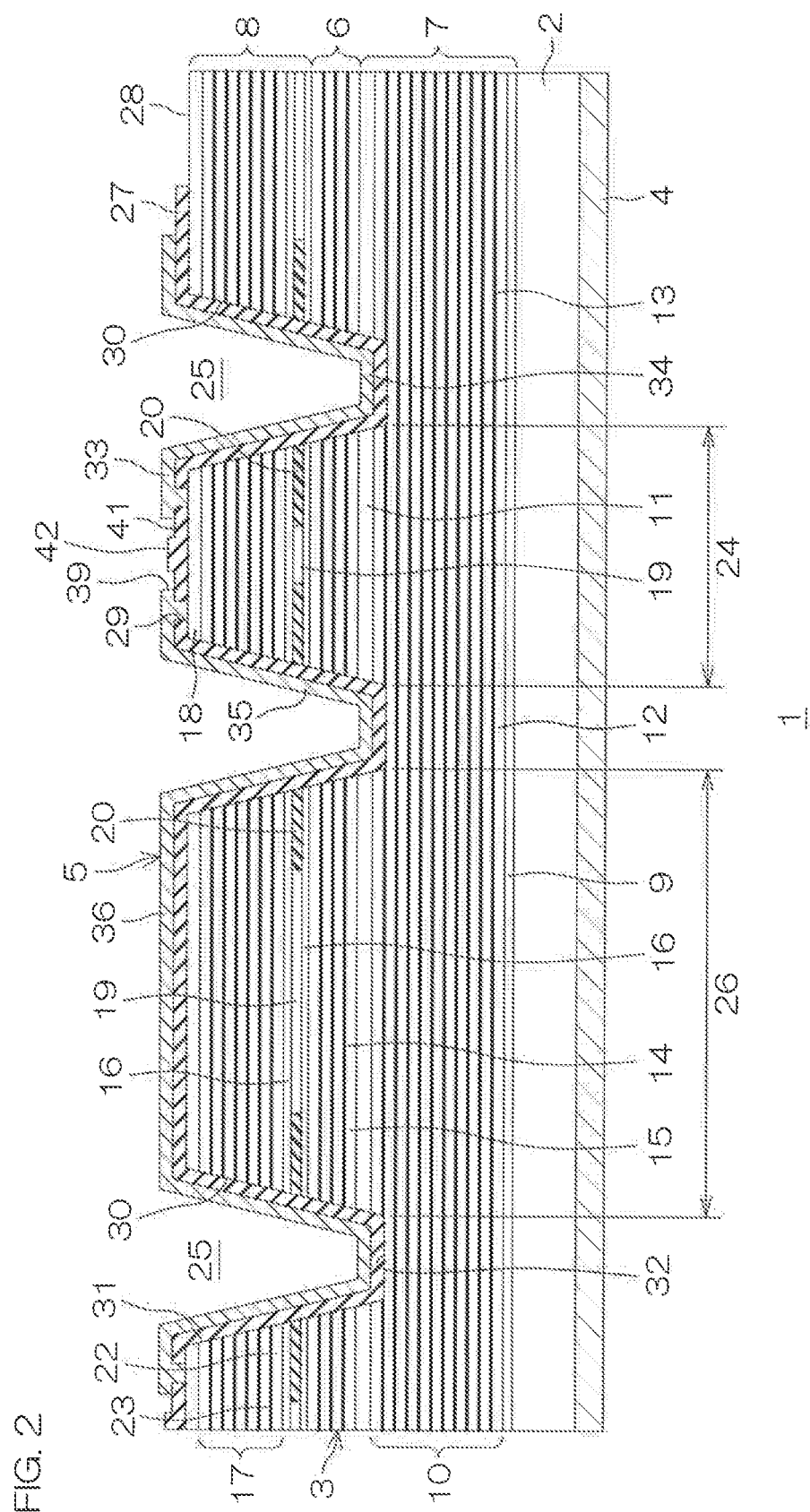
FIG. 2 is a schematic cross-sectional view of the surface-emitting semiconductor laser in section line II-II of FIG. 1.
Figure 3:
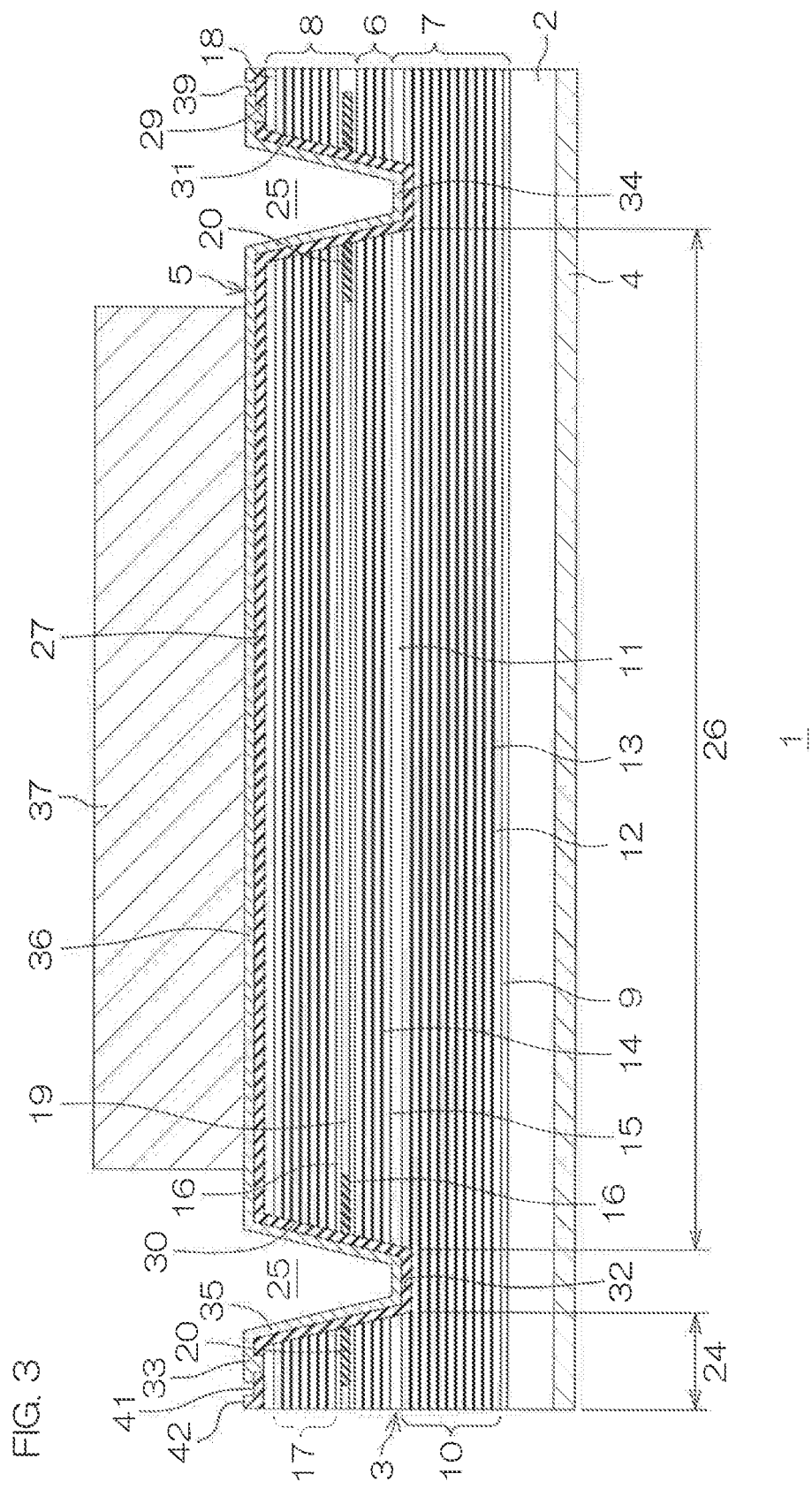
FIG. 3 is a schematic cross-sectional view of the surface-emitting semiconductor laser in section line III-III of FIG. 1.
Figure 4:
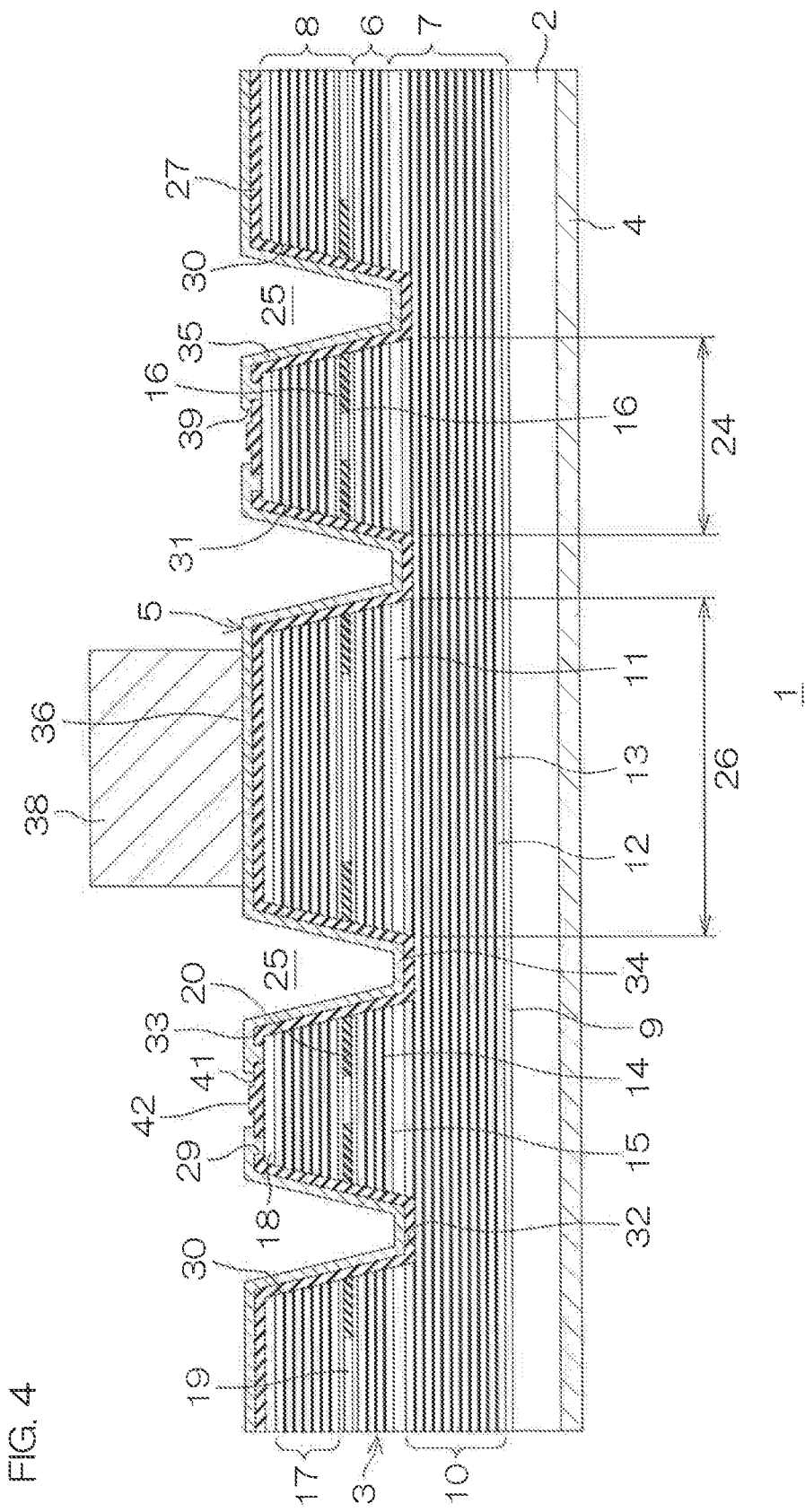
FIG. 4 is a schematic cross-sectional view of the surface-emitting semiconductor laser in section line IV-IV of FIG. 1.

FIG. 1 is a schematic plan view of a surface-emitting semiconductor laser 1 according to a preferred embodiment of the present invention. FIG. 2 is a schematic cross-sectional view of the surface-emitting semiconductor laser 1 in section line II-II of FIG. 1. FIG. 3 is a schematic cross-sectional view of the surface-emitting semiconductor laser 1 in section line III-III of FIG. 1. FIG. 4 is a schematic cross-sectional view of the surface-emitting semiconductor laser 1 in section line IV-IV of FIG. 1. It should be noted that ratios of individual constituents among FIG. 2, FIG. 3, and FIG. 4 do not coincide with each other.

The surface-emitting semiconductor laser 1 is a vertical cavity surface emitting laser (VCSEL) that includes a substrate 2, a semiconductor laminated structure 3 (group-III nitride semiconductor laminated structure) formed on the substrate 2, an n-side electrode 4 formed on a rear surface of the substrate 2 (a surface on the side opposite to the semiconductor laminated structure), which is an example of a first electrode of the present invention, and a p-side electrode 5 formed on a surface of the semiconductor laminated structure 3, which is an example of a second electrode of the present invention.

As shown in FIG. 1, the substrate 2 is formed in a rectangular shape in a plan view, and, for example, the length of its long side 2A is about 900 μm±5 μm, and the length of its short side 2B is about 470 μm±5 μm. The substrate 2 is formed of an n type GaAs single-crystal substrate in the present preferred embodiment, and has a thickness of, for example, 70 μm to 300 μm. Additionally, the substrate 2 is doped with an n type impurity (for example, Si) whose concentration is, for example, $5×10^{17}$ $cm^{-3}$ to $4×10^{18}$ $cm^{-3}$. For example, in this substrate 2, a c plane or an m plane is set as a principal plane. The semiconductor laminated structure 3 is formed by crystal growth on the principal plane. Therefore, the semiconductor laminated structure 3 is made of a group-III nitride semiconductor in which a crystal plane that is the same as the principal plane of the substrate 2 is set as a growth principal plane. A group-III nitride semiconductor is epitaxially grown on the GaAs single-crystal substrate in which a nonpolar plane (particularly, m plane) is set as a principal plane, thus making it possible to grow an excellent group-III nitride semiconductor crystal in which dislocation has been made smaller.

The semiconductor laminated structure 3 includes an active layer 6, an n type semiconductor layer 7 that is an example of a first-conductivity-type layer of the present invention, and a p type semiconductor layer 8 that is an example of a second-conductivity-type layer of the present invention. The n type semiconductor layer 7 is placed on the substrate-2 side with respect to the active layer 6, and the p type semiconductor layer 8 is placed on the p-side-electrode-5 side with respect to the active layer 6. Accordingly, the active layer 6 is sandwiched between the n type semiconductor layer 7 and the p type semiconductor layer 8, and a double heterojunction is made. Electrons are implanted from the n type semiconductor layer 7 into the active layer 6, and holes are implanted from the p type semiconductor layer 8 into the active layer 6. These are recombined together in the active layer 6, and, as a result, light is generated.

The n type semiconductor layer 7 is formed by stacking an n type buffer layer 9, an n type DBR (Distributed Bragg Reflector) layer 10, and an n type cladding layer 11 together in order from the substrate-2 side.

The n type buffer layer 9 is made of n type GaAs in the present preferred embodiment, and has a thickness of, for example, 0.05 μm to 0.2 μm. Additionally, the n type buffer layer 9 is doped with an n type impurity (for example, Si) whose concentration is, for example, $1×10^{18}$ $cm^{-3}$ to $3×10^{18}$ $cm^{-3}$.

The n type DBR layer 10 is formed by repeatedly stacking together an n type $Al_{0.16}Ga_{0.84}As$ layer 12 (low Al composition layer) that has a thickness of, for example, 600 Å and that is relatively low in Al composition and an n type $Al_{0.92}Ga_{0.16}As$ layer 13 (high Al composition layer) that has a thickness of, for example, 700 Å and that is relatively high in Al composition alternately in a plurality of cycles (for example, 20 cycles) in the present preferred embodiment. The n type $Al_{0.16}Ga_{0.84}As$ layer 12 and the n type $Al_{0.92}Ga_{0.16}As$ layer 13 are doped with n type impurities (for example, Si) whose concentrations are, for example, $2×10^{17}$ $cm^{-3}$ to $3×10^{18}$ $cm^{-3}$ and $2×10^{17}$ $cm^{-3}$ to $3×10^{18}$ $cm^{-3}$, respectively.

The n type DBR layer 10 is to employ interference phenomena between beams of light reflected from a plurality of interfaces formed of the n type $Al_{0.16}Ga_{0.84}As$ layer 12 and the n type $Al_{0.92}Ga_{0.16}As$ layer 13, and is to make the strength of reflected light higher by strengthening each other in such a way as to shift the phase of light reflected from different interfaces by 360°. In order to carry out operations in this way, the thickness of the n type $Al_{0.16}Ga_{0.84}As$ layer 12 is determined by $\lambda/4n1$, and the thickness of the n type $Al_{0.92}Ga_{0.16}As$ layer 13 is determined by $\lambda/4n2$, where n1 is the refractive index of the n type $Al_{0.16}Ga_{0.84}As$ layer 12, and n2 is the refractive index of the n type $Al_{0.92}Ga_{0.16}As$ layer 13, and $\lambda$ is the wavelength of laser light to be resonated in a laser resonator. The same as above applies to a p type $Al_{0.16}Ga_{0.84}As$ layer 22 and a p type $Al_{0.92}Ga_{0.16}As$ layer 23 in a p type DBR layer 17 described later.

The n type cladding layer 11 is made of n type AlGaAs in the present preferred embodiment, and has a thickness of, for example, 0.08 μm to 0.12 μm. Additionally, the n type cladding layer 11 may be doped with an n type impurity (for example, Si) whose concentration is, for example, $3×10^{18}$ $cm^{-3}$ or less, or may be undoped.

The active layer 6 is an active layer that has a quantum well structure, and has a structure in which a well layer is placed between barrier layers, each of which has a greater bandgap than the well layer, in a sandwiched manner. This quantum well structure may employ not a mono-structure but a multi-structure, and, if so, the quantum well structure is a MQW (Multi Quantum Well) structure.

The active layer 6 is formed by a multi quantum well structure in which an undoped GaAs well layer 14 and an undoped AlGaAs barrier layer 15 are alternately stacked together in the present preferred embodiment. For example, first, an undoped $Al_{0.35}Ga_{0.65}As$ barrier layer 15 having a thickness of 100 Å is formed. Thereafter, an undoped GaAs well layer 14 having a thickness of 80 Å and an undoped $Al_{0.35}Ga_{0.65}As$ barrier layer 15 having a thickness of 100 Å are formed on the barrier layer 15 while being alternately repeated in 2 to 6 cycles. Thereafter, the undoped GaAs well layer 14 whose thickness is 80 Å is stacked on the resulting layer. Furthermore, the undoped $Al_{0.35}Ga_{0.65}As$ barrier layer 15 whose thickness is 100 Å is stacked on the well layer 14. In other words, both sides of the multi quantum well structure are each formed with the barrier layer 15 made of the undoped $Al_{0.35}Ga_{0.65}As$ layer that differs in thickness from the intermediate barrier layer 15.

The p type semiconductor layer 8 is formed by stacking together a p type cladding layer 16, a p type DBR (Distributed Bragg Reflector) layer 17, and a p type contact layer 18 on the active layer 6 in this order.

The p type cladding layer 16 is made of p type AlGaAs in the present preferred embodiment, and has a thickness of, for example, 0.08 μm to 0.12 μm. Additionally, the p type cladding layer 16 may be doped with a p type impurity (for example, C) whose concentration is, for example, $5\times10^{18}$ $cm^{-3}$ or less, or may be undoped.

A p type layer 19 and a current constriction layer 20 surrounding the p type layer 19 are formed at the p type cladding layer 16. In the p type layer 19 and the current constriction layer 20, each other's upper surfaces and lower surfaces are continuously formed along a stacked-layer interface of the semiconductor laminated structure 3 in the present preferred embodiment. The p type layer 19 is made of p type AlGaAs that is higher in Al composition than the p type cladding layer 16 in the present preferred embodiment. For example, the p type cladding layer 16 may be an $Al_{0.6}Ga_{0.4}As$ layer, and the p type layer 19 may be an $Al_{0.98}Ga_{0.2}As$ layer. On the other hand, the current constriction layer 20 is formed of an oxide insulating layer that contains Al in the present preferred embodiment. Additionally, the p type layer 19 and the current constriction layer 20 each have a thickness of 15 nm to 50 nm. Additionally, the p type layer 19 is doped with a p type impurity (for example, C) whose concentration is, for example, $5\times10^{18}$ $cm^{-3}$ to $2\times10^{19}$ $cm^{-3}$.

An electric current flowing through the surface-emitting semiconductor laser 1 does not flow to the current constriction layer 20 in the p type cladding layer 16, and is constricted by the p type layer 19 surrounded by the current constriction layer 20, so that a region of the active layer 6 facing the p type layer 19 serves as a light emission region.

The p type layer 19 and the current constriction layer 20 may be selectively formed at a halfway portion in the thickness direction of the p type cladding layer 16 as shown in FIG. 2 to FIG. 4. In this case, the p type cladding layer 16 is placed at both sides of the p type layer 19 and the current constriction layer 20 in the lamination direction of the semiconductor laminated structure 3. Additionally, the p type layer 19 and the current constriction layer 20 may be formed from one end to the other end in the thickness direction of the p type cladding layer 16 (i.e., the p type layer 19 may be the p type cladding layer 16), not shown. Additionally, as in the present preferred embodiment, the current constriction layer 20 may be formed between the p type DBR layer 17 and the active layer 6 as a part of the laminated structure of the p type semiconductor layer 8, or may be formed between the p type semiconductor layer 8 and the active layer 6 independently of the laminated structure of the p type semiconductor layer 8. In other words, the current constriction layer 20 is merely required to be formed on the active layer 6 and be formed closer to the active-layer-6 side than a front surface of the p type semiconductor layer 8.

The p type DBR layer 17 is formed by repeatedly stacking together a p type $Al_{0.16}Ga_{0.84}As$ layer 22 (low Al composition layer) that has a thickness of, for example, 600 Å and that is relatively low in Al composition and a p type $Al_{0.92}Ga_{0.16}As$ layer 23 (high Al composition layer) that has a thickness of, for example, 700 Å and that is relatively high in Al composition alternately in a plurality of cycles (for example, 20 cycles) in the present preferred embodiment. The p type $Al_{0.16}Ga_{0.84}As$ layer 22 and the p type $Al_{0.92}Ga_{0.16}As$ layer 23 are doped with p type impurities (for example, C) whose concentrations are, for example, $2\times10^{18}$ $cm^{-3}$ to $1\times10^{19}$ $cm^{-3}$ and $2\times10^{18}$ $cm^{-3}$ to $1\times10^{19}$ $cm^{-3}$, respectively.

The p type contact layer 18 is made of p type GaAs in the present preferred embodiment, and has a thickness of, for example, 0.02 μm to 0.08 μm. Additionally, the p type contact layer 18 is doped with a p type impurity (for example, C) whose concentration is, for example, $1\times10^{19}$ $cm^{-3}$ to $5\times10^{19}$ $cm^{-3}$.

A mesa structure portion 24 is formed in the semiconductor laminated structure 3. More specifically, an annular trench 25 is formed in the semiconductor laminated structure 3, and the mesa structure portion 24 having a substantially trapezoidal shape in a cross-sectional view is formed inside the trench 25.

In the present preferred embodiment, a plurality of trenches 25 are mutually independently formed substantially on the whole of the surface of the semiconductor laminated structure 3 in a plan view as shown in FIG. 1. The mesa structure portion 24 is placed so as to be surrounded by each of the trenches 25. The arrangement pattern of the mesa structure portion 24 may be a staggered arrangement as shown in FIG. 1, or may be a matrix arrangement.

In the surface-emitting semiconductor laser 1, light is emitted in the active layer 6 of each of the mesa structure portions 24, and laser oscillation is performed from a top surface of the mesa structure portion 24 by amplifying the light. In the plane of the substrate 2, a distance L1 (light emission point size in a direction of a long side) between the mesa structure portions 24 of both end portions in a direction along a long side 2A may be, for example, about 800 μm, and a distance L2 (light emission point size in the direction of the short side) between the mesa structure portions 24 of both end portions in a direction along a short side 2B may be, for example, about 350 μm. Additionally, a distance L3 (pitch of the mesa structure portion) between adjoining mesa structure portions 24 may be, for example, about 80 μm.

On the other hand, in the semiconductor laminated structure 3, a laminated structure consisting of the n type semiconductor layer 7, the active layer 6, and the p type semiconductor layer 8 that are formed outside the trench 25 and that do not contribute to laser oscillation may be defined as a field structure portion 26. The field structure portion 26 is a laminated structure portion that extends continuously between adjoining mesa structure portions 24 and that spreads over the entirety of the surface of the semiconductor laminated structure 3 in a plan view as shown in FIG. 1.

Additionally, a second side surface 30 of each of the trenches 25 (wall surface of the field structure portion 26) and a first side surface 31 (wall surface of the mesa structure portion 24) are respectively inclined surfaces that incline with respect to a bottom surface 32 of the trench 25. Hence, the trench 25 is formed in a tapered shape that becomes thinner toward the bottom surface 32 in a cross-sectional view.

A surface insulating film 27 that is an example of an insulating layer of the present invention is formed so as to cover the surface of the semiconductor laminated structure 3. The surface insulating film 27 is formed at the entirety of parts other than a peripheral edge portion 28 of the semiconductor laminated structure 3 in a plan view as shown in FIG. 1.

On the other hand, the peripheral edge portion 28 of the semiconductor laminated structure 3 is a remaining portion of a dicing line that is cut by a dicing saw in a dicing step of a process of manufacturing the surface-emitting semiconductor laser 1, and is exposed in its whole circumference. The surface insulating film 27 is made of a material that has translucency with respect to the emission wavelength (wavelength of laser light) λ of the active layer 6, and is made of, for example, silicon oxide ($SiO_2$), silicon nitride (SiN), or the like. Additionally, a contact hole 29 that selectively exposes the p type contact layer 18 of the mesa structure portion 24 is formed in the surface insulating film 27 as shown in FIG. 2 to FIG. 4.

The p-side electrode 5 is formed so as to come into contact with the surface of the semiconductor laminated structure 3 in the present preferred embodiment. The p-side electrode 5 covers the entirety of the surface of the surface insulating film 27 so as to expose the peripheral edge portion 28 of the semiconductor laminated structure 3. The p-side electrode 5 is formed by stacking a Ti layer and an Au layer together in order from the semiconductor-laminated-structure-3 side in the present preferred embodiment. The thickness of the p-side electrode 5 may be, for example, 0.1 µm to 0.3 µm.

Additionally, the p-side electrode 5 may be defined as a contact portion 33 along the top surface of the mesa structure portion 24, as a bottom surface portion 34 and a side surface portion 35 that are along the bottom surface 32 and the side surfaces 30 and 31 of the trench 25, and as a field portion 36 along a top surface of the field structure portion 26 in each region in which the p-side electrode 5 is placed.

The contact portion 33 of the p-side electrode 5 is connected to the p type contact layer 18 of the mesa structure portion 24 through the contact hole 29 of the surface insulating film 27. Additionally, an opening 39 for laser oscillation by which a part of the surface insulating film 27 is exposed is formed in the contact portion 33 of the p-side electrode 5 in a region placed at a more inward position than the contact hole 29 (in a region surrounded by the contact hole 29).

Additionally, a metal layer 37 for wire bonding and a metal layer 38 for heat dissipation are selectively formed on the field portion 36 of the p-side electrode 5. Each of the metal layers 37 and 38 has a thickness greater than the p-side electrode 5, and its thickness may be, for example, 2 µm to 4 µm. Additionally, each of the metal layers 37 and 38 may be formed of an Au layer in the present preferred embodiment. If the p-side electrode 5 has a laminated structure formed of a Ti layer and an Au layer and if each of the metal layers 37 and 38 is formed of an Au layer, the interface between these components becomes an Au/Au interface, and therefore there is a case in which a clear interface shown in FIG. 2 to FIG. 4 does not exist.

Additionally, the metal layer 37 for wire bonding is disposed at a peripheral edge portion of the p-side electrode 5 (near the peripheral edge portion 28 of the semiconductor laminated structure 3), and the metal layer 38 for heat dissipation is disposed at a central portion of the p-side electrode 5 in a plan view as shown in FIG. 1.

The metal layer 37 for wire bonding is disposed at the peripheral edge portion of the p-side electrode 5, thus making it possible to prevent a wire from passing above the mesa structure portion 24, and therefore it is possible to prevent a wire from disturbing laser oscillation.

On the other hand, the metal layer 38 for heat dissipation is disposed between adjoining mesa structure portions 24 in the central portion of the p-side electrode 5, thus making it possible to collect heat from the plurality of mesa structure portions 24 disposed around the metal layer 38 and efficiently dissipate the heat while effectively using a space on the p-side electrode 5.

The n-side electrode 4 is formed so as to come into contact with the rear surface of the substrate 2 in the present preferred embodiment. The n-side electrode 4 is formed by stacking an AuGe layer, a Ni layer, and an Au layer together in order from the substrate-2 side. The thickness of the n-side electrode 4 may be, for example, 0.1 µm to 0.6 µm.

In the surface-emitting semiconductor laser 1, the n-side electrode 4 and the p-side electrode 5 are connected to a power source, and electrons and holes are implanted into the active layer 6 from the n type semiconductor layer 7 and from the p type semiconductor layer 8, and, as a result, it is possible to generate recombination between electrons and holes in the active layer 6 of each of the mesa structure portions 24 and emit light having, for example, a wavelength Λ=840 nm to 860 nm. This light resonates while reciprocating between the n type DBR layer 10 and the p type DBR layer 17 along a direction perpendicular to the substrate 2, and is amplified. Thereafter, laser power is taken out through the opening 39 for laser oscillation outwardly from the top surface of each of the mesa structure portions 24 that is a laser emission end surface.

Next, a structure of the mesa structure portion 24 of the surface-emitting semiconductor laser 1 will be described in more detail.

Figure 5:
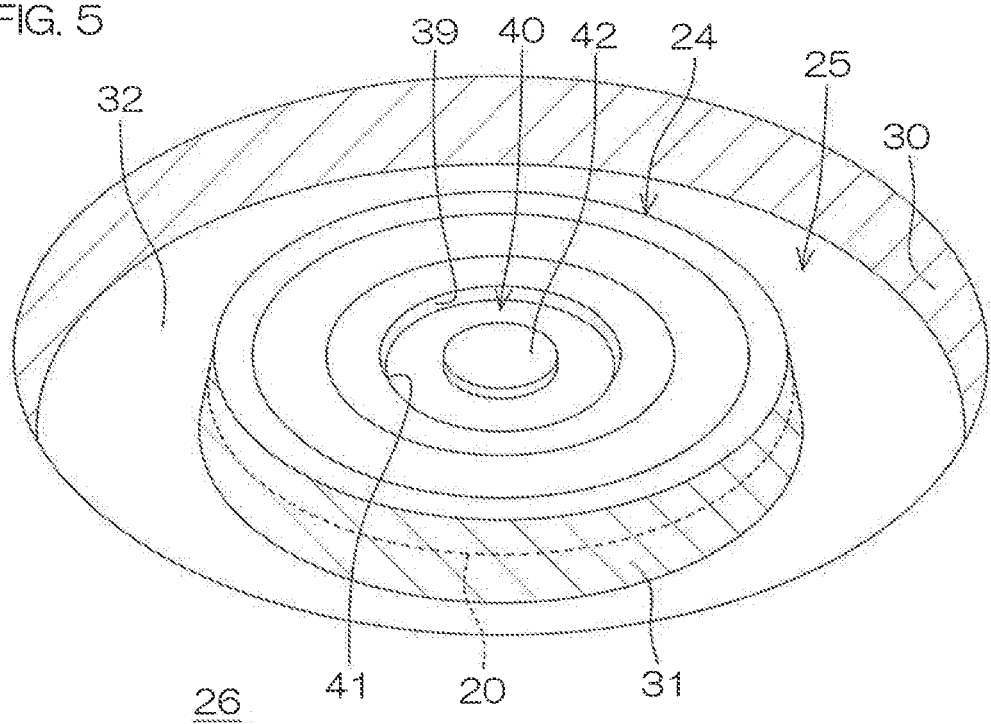
FIG. 5 is a schematic enlarged perspective view of a mesa structure portion of FIG. 1.
Figure 6:
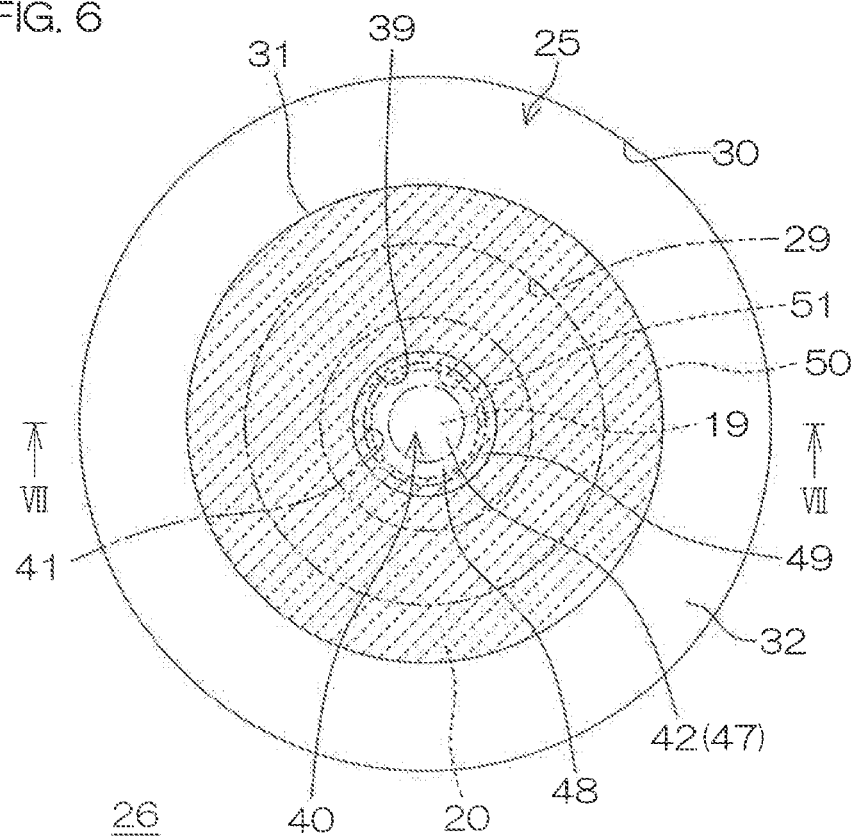
FIG. 6 is a schematic enlarged plan view of the mesa structure portion of FIG. 1.
Figure 7:
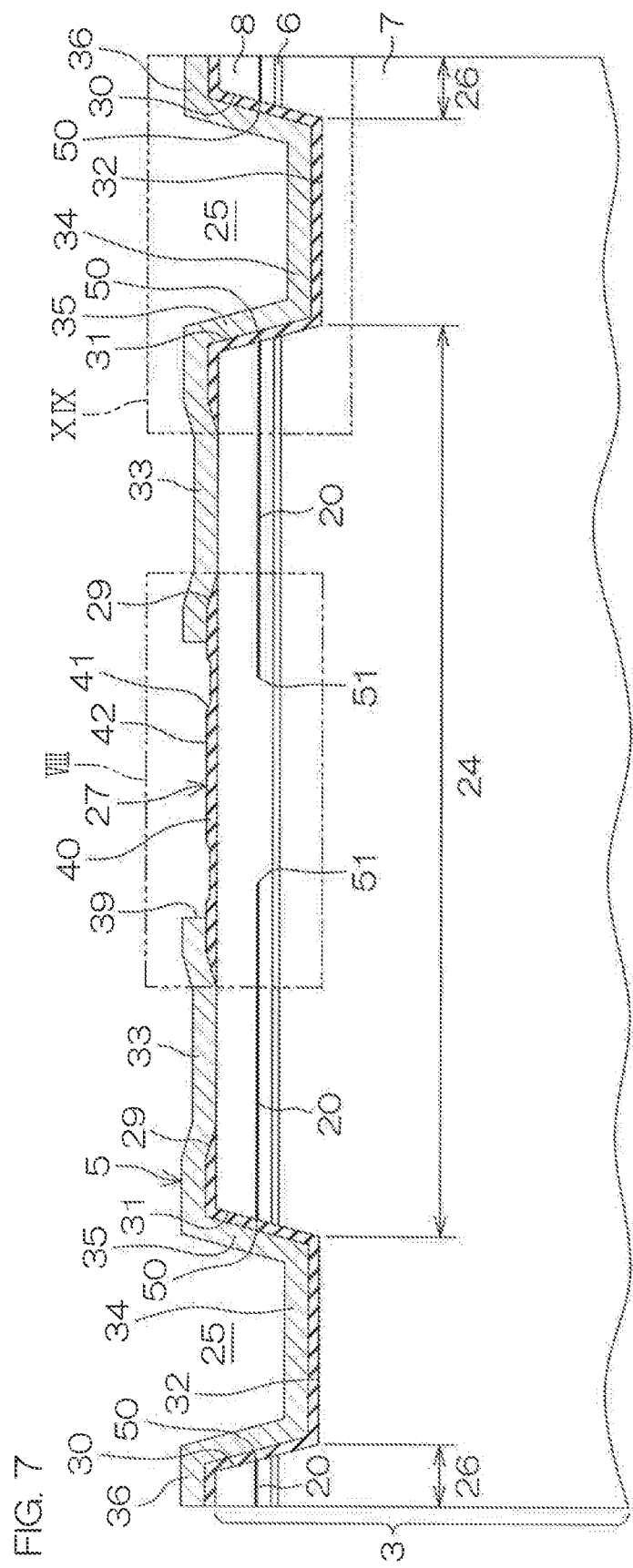
FIG. 7 is a schematic cross-sectional view of the mesa structure portion in section line VII-VII of FIG. 6.
Figure 8:
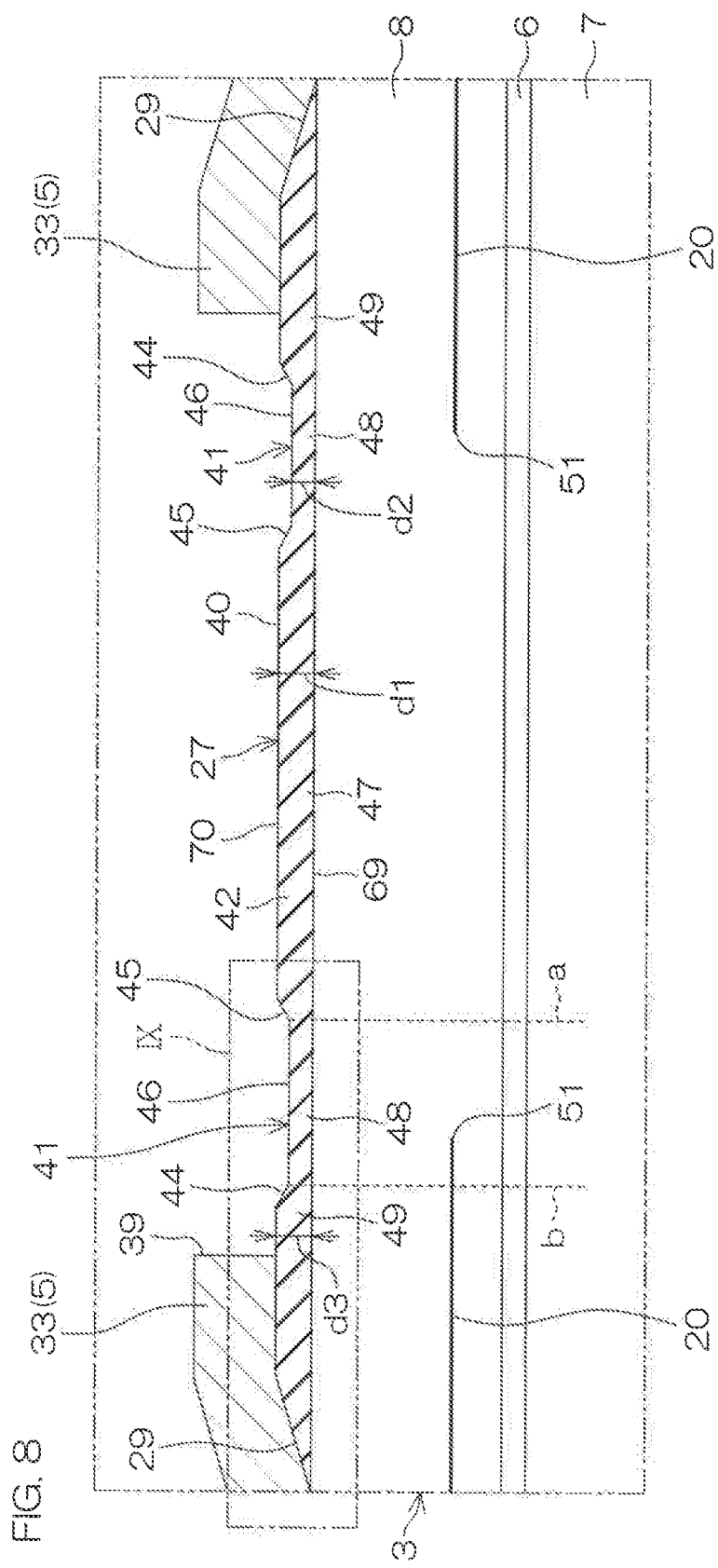
FIG. 8 is an enlarged view of a part surrounded by an alternate long and two short dashed line VIII of FIG. 7.
Figure 9:
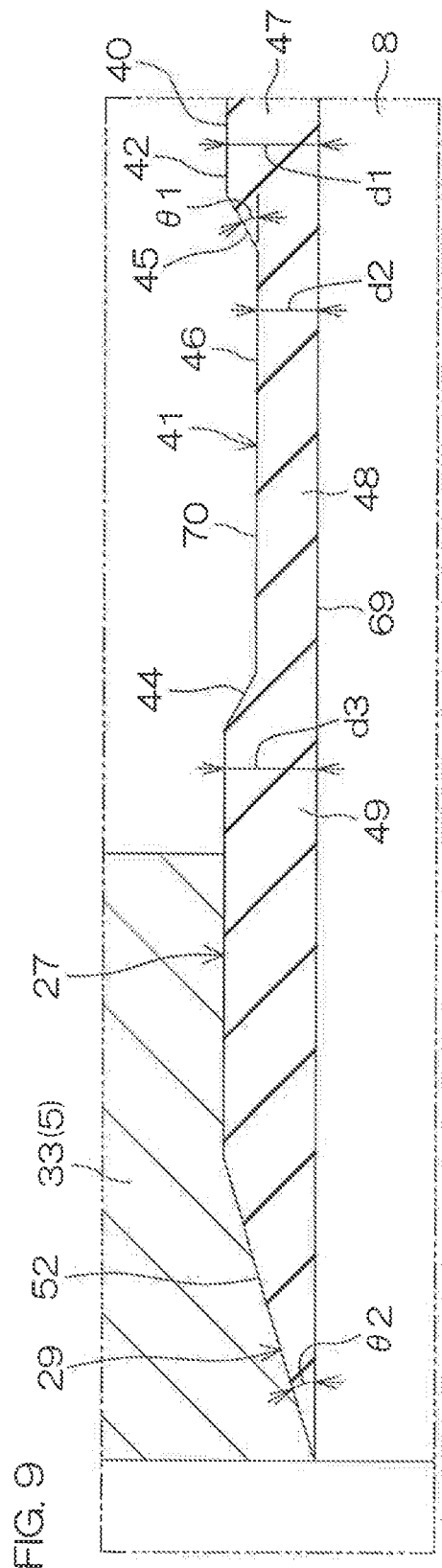
FIG. 9 is an enlarged view of a part surrounded by an alternate long and two short dashed line IX of FIG. 8.

FIG. 5 is a schematic enlarged perspective view of the mesa structure portion 24 of FIG. 1. FIG. 6 is a schematic enlarged plan view of the mesa structure portion 24 of FIG. 1. FIG. 7 is a schematic cross-sectional view of the mesa structure portion 24 in section line VII-VII of FIG. 6. FIG. 8 is an enlarged view of a part surrounded by an alternate long and two short dashed line VIII of FIG. 7. FIG. 9 is an enlarged view of a part surrounded by an alternate long and two short dashed line IX of FIG. 8. It should be noted that ratios of individual constituents between FIG. 2 to FIG. 4 and FIG. 5 to FIG. 9 do not coincide with each other.

As described above, the surface insulating film 27 has an exposed portion 40 exposed from the opening 39 for laser oscillation in a region on the mesa structure portion 24. An annular concave portion 41 that is selectively concaved is formed at the exposed portion 40. A dotted first convex portion 42 is formed at an inner portion surrounded by the concave portion 41. Additionally, an annular second convex portion 43 that surrounds the concave portion 41 is formed outside the concave portion 41 in the present preferred embodiment. In other words, the concave portion 41 is defined between the first convex portion 42 and the second convex portion 43, and has a first side surface 45 (wall surface of the first convex portion 42) and a second side surface 44 (wall surface of the second convex portion 43) as shown in FIG. 8 and FIG. 9, and these surfaces are connected together by means of a flat bottom surface 46.

More specifically, the first side surface 45 and the second side surface 44 of the concave portion 41 are respectively inclined surfaces that incline with respect to the bottom surface 46, and therefore the concave portion 41 has a tapered shape whose width becomes smaller toward the bottom surface 46 in a cross-sectional view. For example, an inclination angle 91 (see FIG. 9) of the first side surface 45 and the second side surface 44 of the concave portion 41 with respect to the bottom surface 46 may be about 30° to 40°. Light that has struck the inclined surfaces 44 and 45 from the semiconductor laminated structure 3 has the effect of gathering at the convex-portion-42 side according to the following relation: Refractive index of Surface insulating film 27>Refractive index of Air, i.e., according to the Snell's law. Therefore, it is possible to obtain the effect of making the radiation angle of light smaller than in a case in which the first side surface 45 and the second side surface 44 are surfaces perpendicular to the bottom surface 46.

Additionally, it is possible to distinguish the exposed portion 40 of the surface insulating film 27 into a first portion 47 formed of the first convex portion 42 and a part directly under the first convex portion 42, a second portion 48 that is formed of a bottom surface portion of the concave portion 41 and that surrounds the first portion 47, and a third portion 49 that is formed of the second convex portion 43 and a part directly under the second convex portion 43 and that surrounds the second portion 48 as shown in FIG. 8 and FIG. 9.

With respect to the film thickness (physical thickness) of the first portion 47 and that of the second portion 48, the optical thickness (second optical thickness) of the second portion 48 is set so that reflectance with respect to the emission wavelength λ of the active layer 6 becomes smaller than the optical thickness (first optical thickness) of the first portion 47.

For example, the thickness d1 of the first portion 47 (distance from a rear surface 69 of the surface insulating film 27 to a front surface 70 of the first convex portion 42) is set so that the first optical thickness becomes (n+1)λ/2 (n: integers) with respect to the emission wavelength λ as shown in FIG. 8 and FIG. 9, and the thickness d2 of the second portion 48 (distance from the rear surface 69 of the surface insulating film 27 to the bottom surface 46 of the concave portion 41) is set so that the second optical thickness becomes (2n+1)λ/4 (n: integers) with respect to the emission wavelength A. When the physical thickness d1 and the physical thickness d2 that are set under this condition are compared with each other, the magnitude relation therebetween is as follows: Thickness d1 of First portion 47>Thickness d2 of Second portion 48.

Additionally, in the present preferred embodiment, the optical thickness (second optical thickness) of the second portion 48 is set so as to become smaller in reflectance with respect to the emission wavelength λ of the active layer 6 even in comparison with the optical thickness (third optical thickness) of the third portion 49. For example, the thickness d3 of the third portion 49 may be equal to the thickness d1 of the first portion 47, and the optical thickness of the third portion 49 may also be equal thereto.

In the present preferred embodiment, the surface insulating film 27 is formed of a monolayer film made of a single material, and may be formed of, for example, the aforementioned silicon oxide ($SiO_2$) film or the aforementioned silicon nitride (SiN) film.

Additionally, the contact hole 29 bored in the surface insulating film 27 is formed in an annular shape in a plan view as shown in FIG. 6 in the same way as the concave portion 41. Additionally, as shown in FIG. 9, the contact hole 29 has a side surface 52 that inclines with respect to the surface of the p type semiconductor layer 8.

Next, with respect to the current constriction layer 20, as shown in FIG. 5 and FIG. 6, the current constriction layer 20 is formed in an annular shape so that its outer peripheral edge 50 is exposed from the first side surface 31 of the trench 25 (from the wall surface of the mesa structure portion 24) in the present preferred embodiment. For clarification, the current constriction layer 20 is shown by broken-line hatching in FIG. 6.

On the other hand, an inner peripheral edge 51 of the current constriction layer 20 (circumferential edge of an opening defined inside the annular current constriction layer 20) is formed along the annular concave portion 41 in a region directly under the annular concave portion 41 more outward than the first portion 47 of the surface insulating film 27, i.e., in more detail, between the first side surface 45 and the second side surface 44 of the annular concave portion 41 (between a supplementary line a that is an extension of a lower end of the first side surface 45 and a supplementary line b that is an extension of a lower end of the second side surface 44) as chiefly shown in FIG. 6 and FIG. 8. Hence, the current constriction layer 20 surrounds the first portion 47 of the surface insulating film 27 in a plan view, and partially covers the annular concave portion 41 (the second portion 48) from the outside.

Likewise, the current constriction layer 20 within the field structure portion 26 is formed so that its outer peripheral edge 50 is exposed from the second side surface 30 of the trench 25 (i.e., from the wall surface of the field structure portion 26).

As described above, according to the surface-emitting semiconductor laser 1, the reflectance of light with the emission wavelength λ is low in the second portion 48 of the exposed portion 40 of the surface insulating film 27 although the optical output according to the higher-order mode becomes large in the outer peripheral portion of the active layer 6 of the mesa structure portion 24. This makes it possible to lower the reflectance of higher-order mode light in the second portion 48 of the surface insulating film 27. As a result, in the second portion 48 of the surface insulating film 27, it is possible to restrain amplification in higher-order mode light that has been emitted from the active layer 6, and it is possible to make optical output smaller than in the first portion 47, and therefore it is possible to preferentially amplify basic-mode light and to oscillate laser light having a narrow radiation angle even if an input current is increased. This makes it possible to provide a surface-emitting semiconductor laser that is capable of outputting laser light having a higher directivity than before.

On the other hand, it is conceivable that the reflectance of higher-order mode light is also lowered by an uneven structure that is obtainable by selectively etching the p type semiconductor layer 8 from its top portion in the same way as above. However, if such a way as to etch a semiconductor layer, such as the p type semiconductor layer 8, is employed, there is a concern that a dislocation defect (crystal defect) will occur in the semiconductor laminated structure 3 because of etching, and influence will be exerted on the amplification of basic-mode light, and, as a result, optical output will be sharply lowered. On the other hand, if the configuration of the surface-emitting semiconductor laser 1 is employed, what is required is merely to apply processing to the surface insulating film 27, and therefore it is possible to prevent a dislocation defect from occurring in the semiconductor laminated structure 3, and it is possible to restrain a decrease in optical output.

Additionally, in the aforementioned arrangement, the current constriction layer 20 is formed to have a comparatively small thickness of 20 nm to 50 nm, and therefore it is possible to improve optical output while being capable of keeping the radiation angle of laser light narrow.

Additionally, the surface insulating film 27 is formed of a monolayer film, and optical refraction does not easily occur in the surface insulating film 27, and therefore it becomes easy to predict the direction of basic-mode oscillation. Therefore, it becomes easy to make an optical design when the surface-emitting semiconductor laser 1 is used as a sensor.

Figure 10:
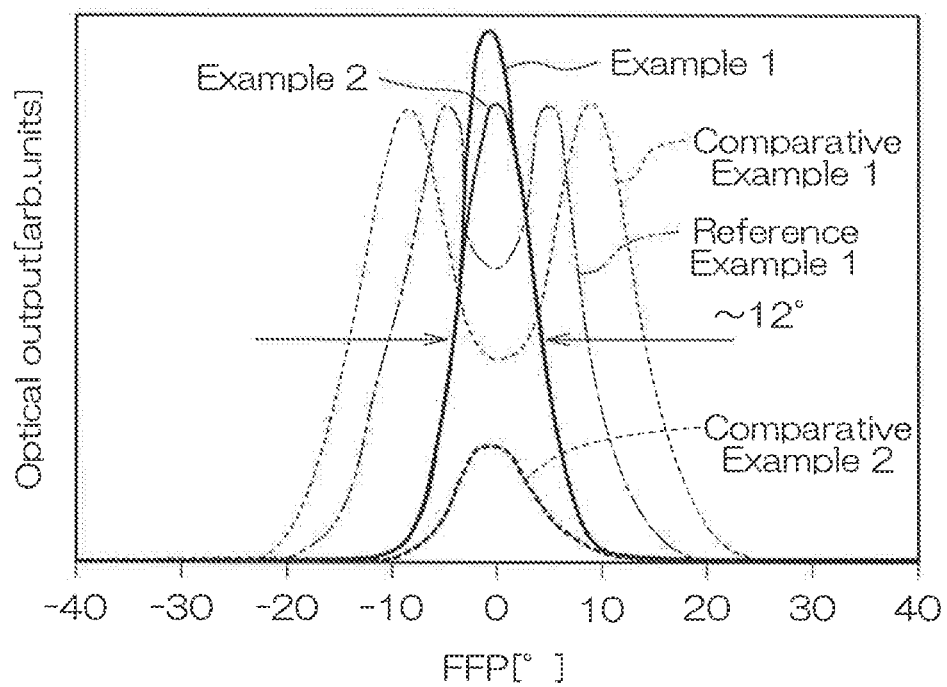
FIG. 10 is a view showing a relationship between the radiation angle of laser light and optical output according to an example, a comparative example, and a reference example.
Figure 11:
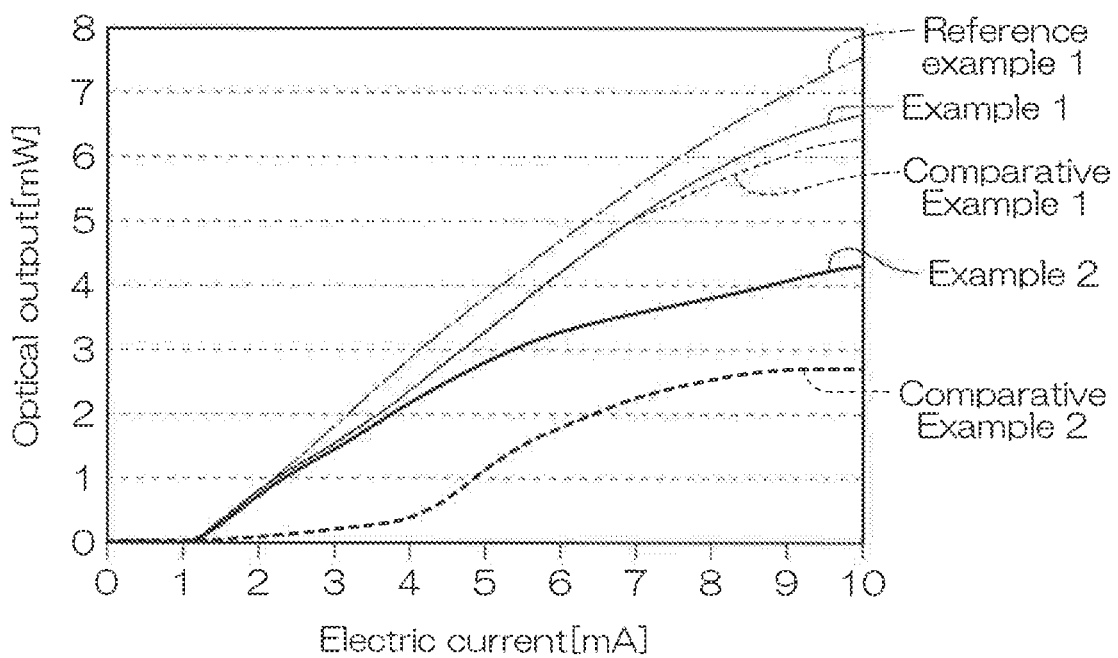
FIG. 11 is a view showing a relationship between an electric current and optical output according to an example, a comparative example, and a reference example.

FIG. 10 is a view showing a relationship (electric current=5 mA) between the radiation angle of laser light and optical output according to an example, a comparative example, and a reference example. FIG. 11 is a view showing a relationship between an electric current and optical output according to an example, a comparative example, and a reference example.

Effects of the surface-emitting semiconductor laser 1 will be described with reference to FIG. 10 and FIG. 11.

First, conditions of the example, conditions of the comparative example, and conditions of the reference example were set as follows, and other conditions were set to be the same. In the following conditions, "Insulating film processed" denotes processing performed to form the concave portion 41 at the surface insulating film 27, and "Epilayer processed" denotes processing of the concave portion 41 performed by etching the p type semiconductor layer 8. Additionally, "Current constriction layer thin" denotes that the thickness of the current constriction layer 20 was set at 300 Å, and "Current constriction layer ordinary" denotes that the thickness of the current constriction layer 20 was set at 800 Å.

Example 1: Insulating film processed, Current constriction layer thin

Example 2: Insulating film processed, Current constriction layer ordinary

Comparative Example 1: Insulating film not processed, Current constriction layer ordinary Comparative Example 2: Insulating film not processed, Epilayer processed, Current constriction layer ordinary Reference Example 1: Insulating film not processed, Current constriction layer thin From results of FIG. 10 and FIG. 11, high optical output can be obtained in accordance with an increase in electric current in Comparative Example 1, and yet higher-order mode light became predominant, and the radiation angle was as much as about 28°. In Comparative Example 2, it was possible to oscillate basic-mode light because of the processing of the epilayer while an increase in optical output was slow even if an electric current was increased, and it was impossible to obtain high optical output.

On the other hand, in Example 2, it was possible to oscillate basic-mode light (radiation angle is about 12°) because of the processing of the insulating film, and it was possible to restrain a decrease in optical output, and it was possible to secure practically-sufficient optical output. Additionally, in Example 1, it was also possible to obtain very high optical output as a result of thinning the current constriction layer.

Additionally, in Reference Example 1, it was possible to make the radiation angle smaller so as to become about 18° than in Comparative Example 1, and it was also possible to improve optical output although it is difficult to clearly define it as a basic mode.

FIG. 12A to FIG. 12H are views showing a process of manufacturing the surface-emitting semiconductor laser 1 in order of process steps.

Next, a method of manufacturing the surface-emitting semiconductor laser 1 will be described with reference to FIG. 12A to FIG. 12H.

In order to manufacture the surface-emitting semiconductor laser 1, for example, the n type semiconductor layer 7, the active layer 6, and the p type semiconductor layer 8 are subjected to epitaxial growth (crystal growth) on a semiconductor wafer (not shown) as shown in FIG. 12A, and, as a result, the semiconductor laminated structure 3 is formed.

Figure 12B:
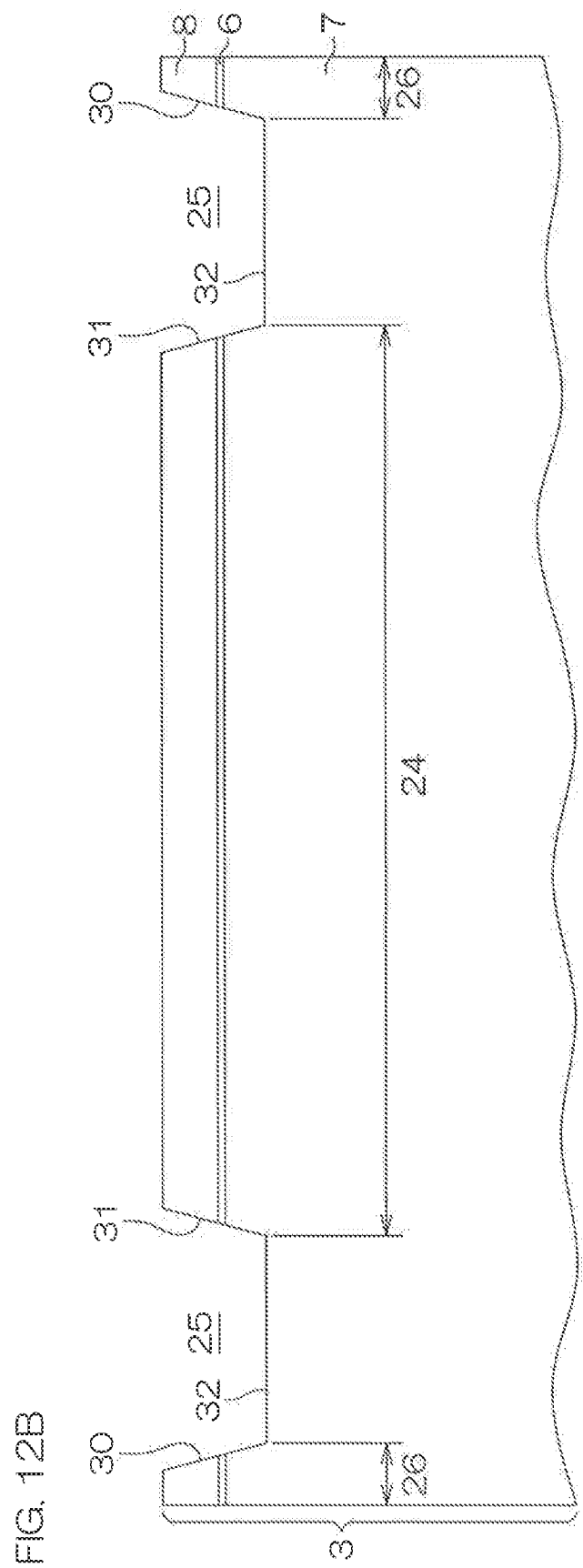
FIG. 12B is a view showing a step subsequent to that of FIG. 12A.

Thereafter, the p type semiconductor layer 8, the active layer 6, and the n type semiconductor layer 7 are selectively removed by, for example, dry etching as shown in FIG. 12B. Hence, the trench 25 is formed in the semiconductor laminated structure 3, and the mesa structure portion 24 is formed inside the annular trench 25, and the field structure portion 26 is formed outside the annular trench 25.

Figure 12C:
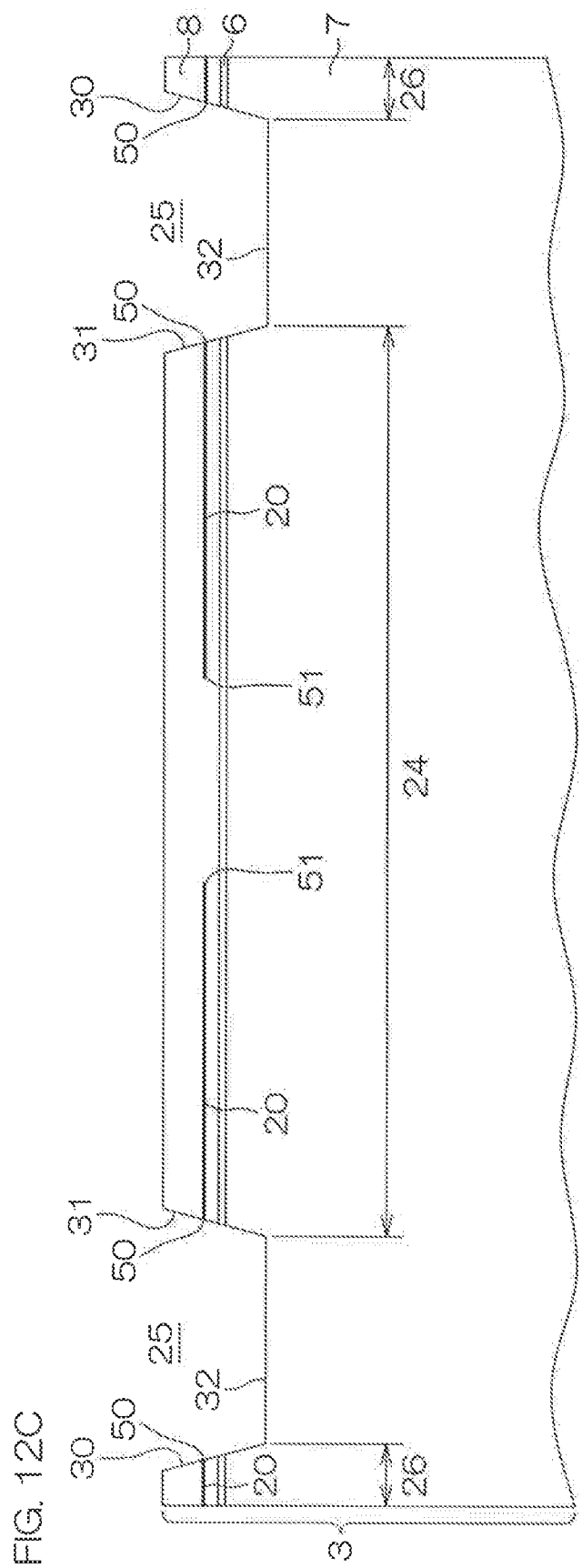
FIG. 12C is a view showing a step subsequent to that of FIG. 12B.

Thereafter, the semiconductor laminated structure 3 undergoes heat treatment in water vapor, and, as a result, the p type layer 19 (not shown) is oxidized from the first side surface 31 of the trench 25 toward the inside of the mesa structure portion 24 and from the second side surface 30 of the trench 25 toward the inside of the field structure portion 26 as shown in FIG. 12C. Hence, the current constriction layer 20 is formed in the p type semiconductor layer 8, and a part of the p type layer 19 remains as a p type semiconductor in such a way as to be surrounded by the resulting layer.

Figure 12D:
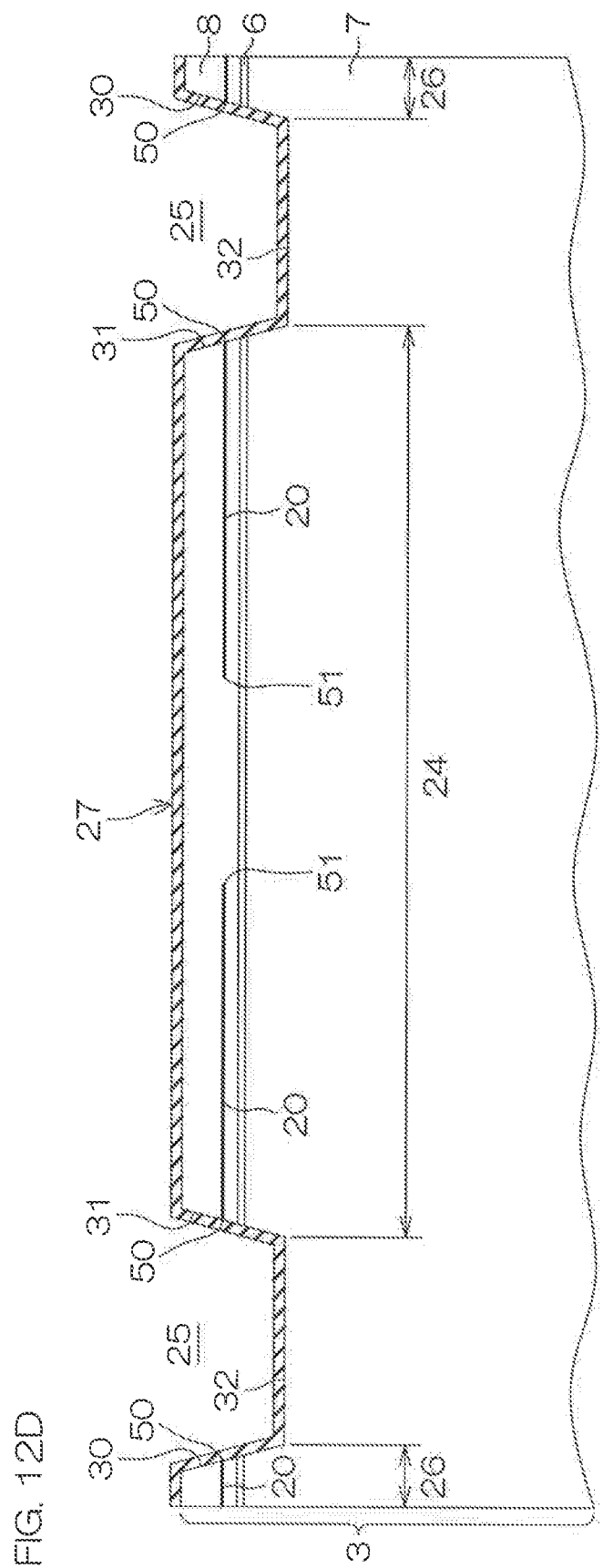
FIG. 12D is a view showing a step subsequent to that of FIG. 12C.

Thereafter, the surface insulating film 27 is formed on the entire surface of the semiconductor laminated structure 3 by, for example, a CVD method as shown in FIG. 12D.

Figure 12E:
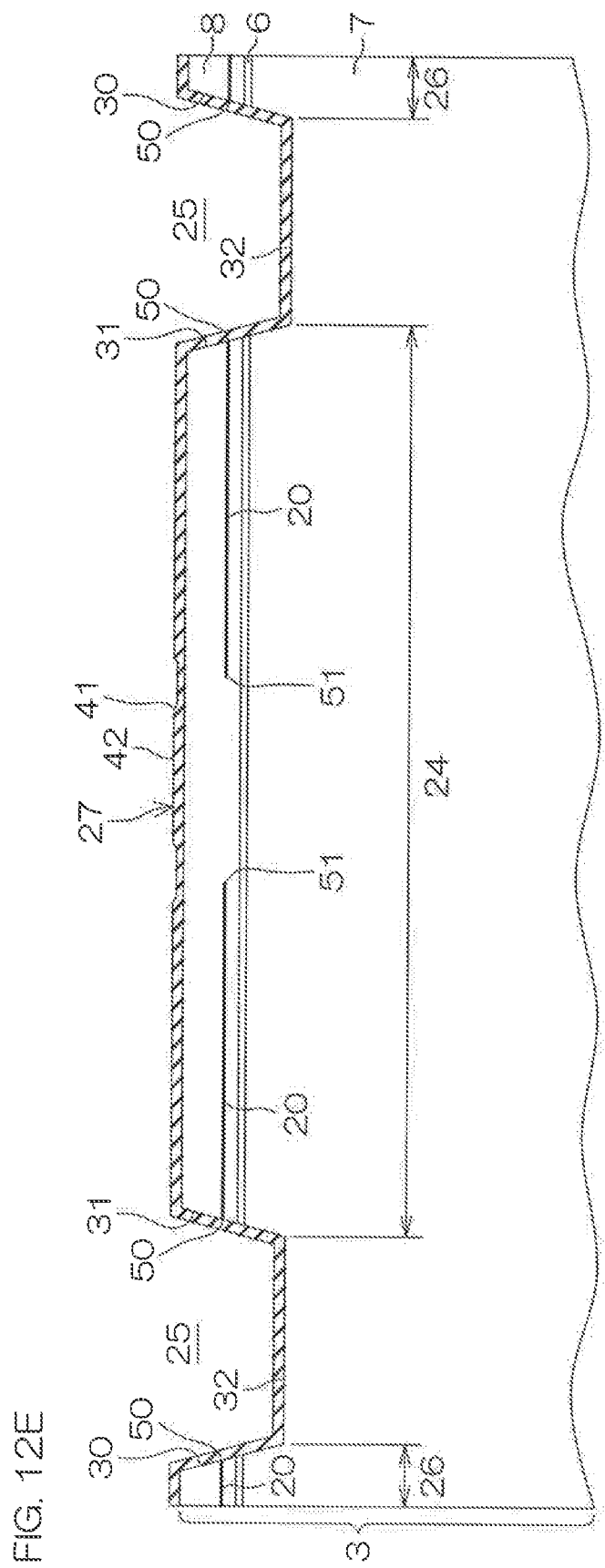
FIG. 12E is a view showing a step subsequent to that of FIG. 12D.

Thereafter, a front-surface portion of the surface insulating film 27 is selectively removed by, for example, wet etching as shown in FIG. 12E. Hence, the annular concave portion 41 is formed at the surface insulating film 27. The concave portion 41 is formed by wet etching, thus making it possible to incline the first side surface 45 and the second side surface 44 of the concave portion 41 with respect to the bottom surface 46 as shown in FIG. 8 and FIG. 9. The concave portion 41 may be formed by selective dry etching.

Figure 12F:
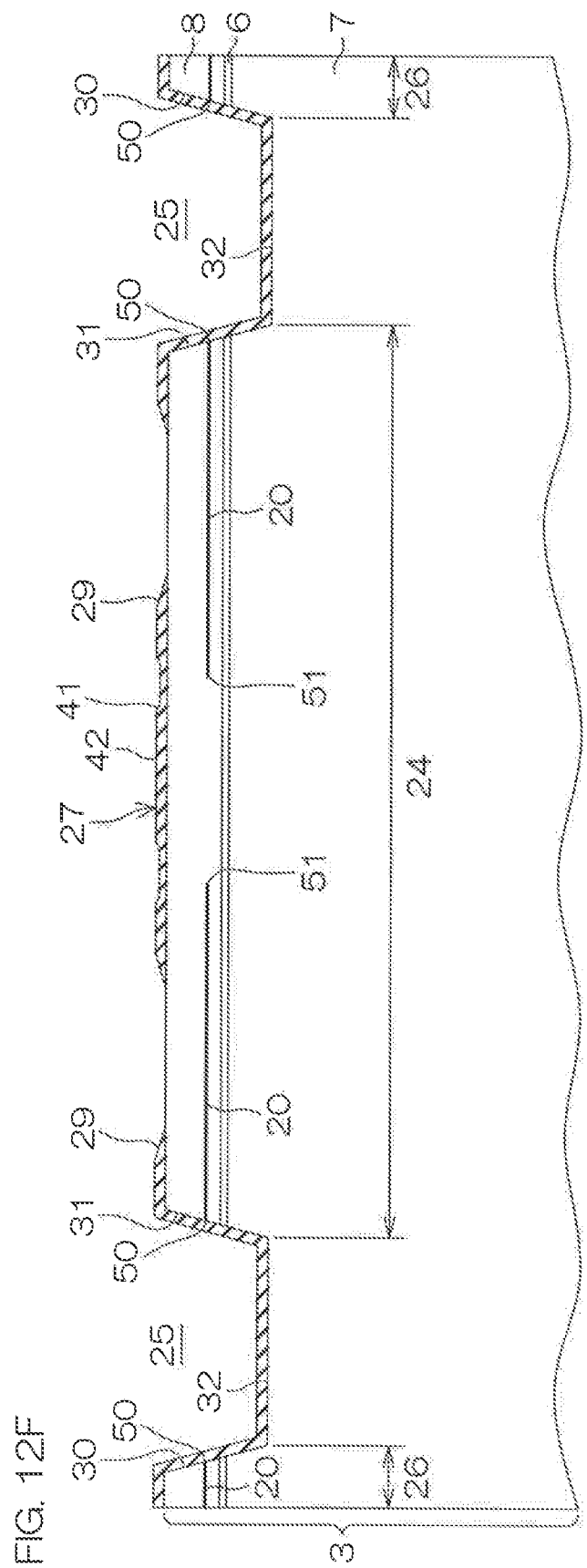
FIG. 12F is a view showing a step subsequent to that of FIG. 12E.

Thereafter, the surface insulating film 27 is selectively removed by, for example, wet etching until the p type semiconductor layer 8 is exposed as shown in FIG. 12F. Hence, the contact hole 29 is formed in the surface insulating film 27. The contact hole 29 is formed by wet etching, thus making it possible to incline the side surface 52 of the contact hole 29 with respect to the surface of the p type semiconductor layer 8 as shown in FIG. 9. The contact hole 29 may be formed by selective dry etching.

Figure 12G:
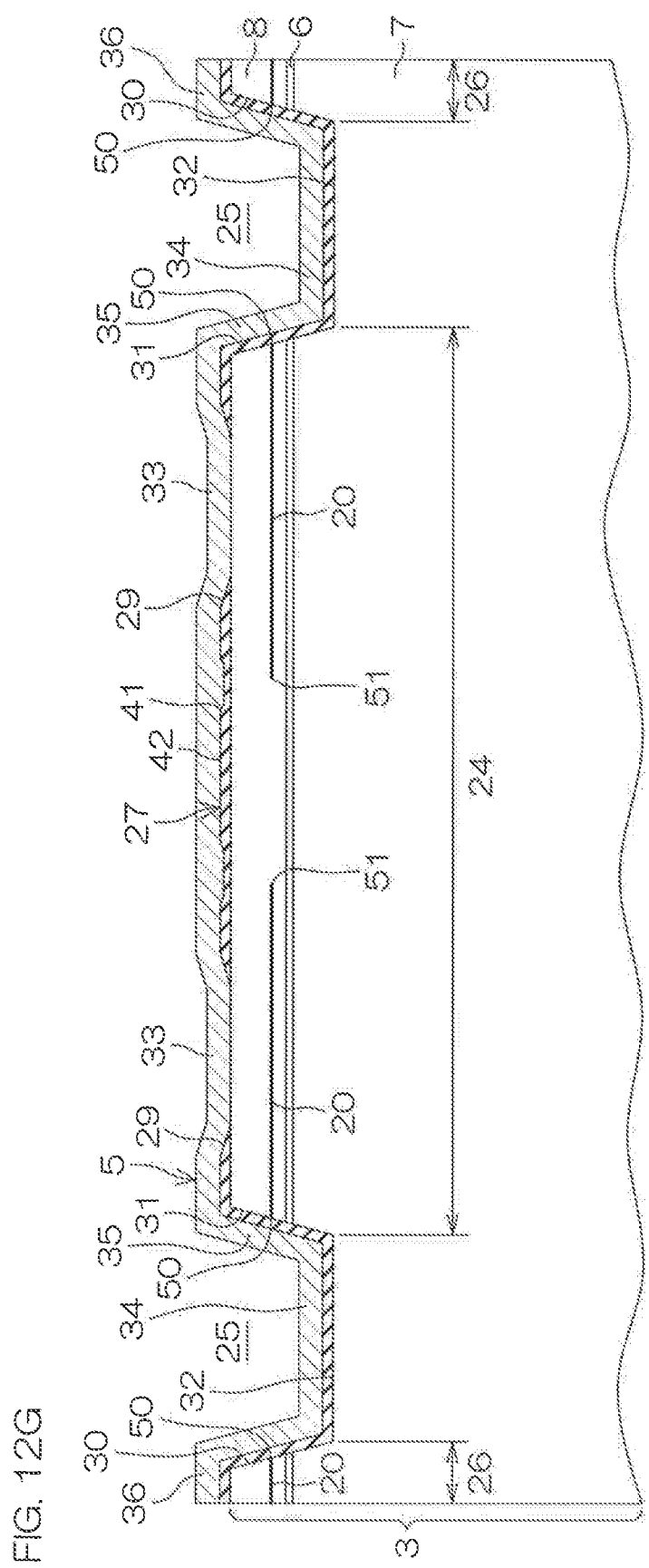
FIG. 12G is a view showing a step subsequent to that of FIG. 12F.

Thereafter, the p-side electrode 5 (surface metal film) is formed on the entire surface of the semiconductor laminated structure 3 by, for example, a vapor deposition method as shown in FIG. 12G. Thereafter, a metal film is formed on the p-side electrode 5 by the vapor deposition method or an electroplating method in a state in which the p-side electrode 5 is selectively covered with a mask (for example, photoresist), not shown. Hence, the metal layer 37 for wire bonding (see FIG. 1 and FIG. 3) and the metal layer 38 for heat dissipation (see FIG. 1 and FIG. 4) that have been selectively formed on the p-side electrode 5 are obtained.

Figure 12H:
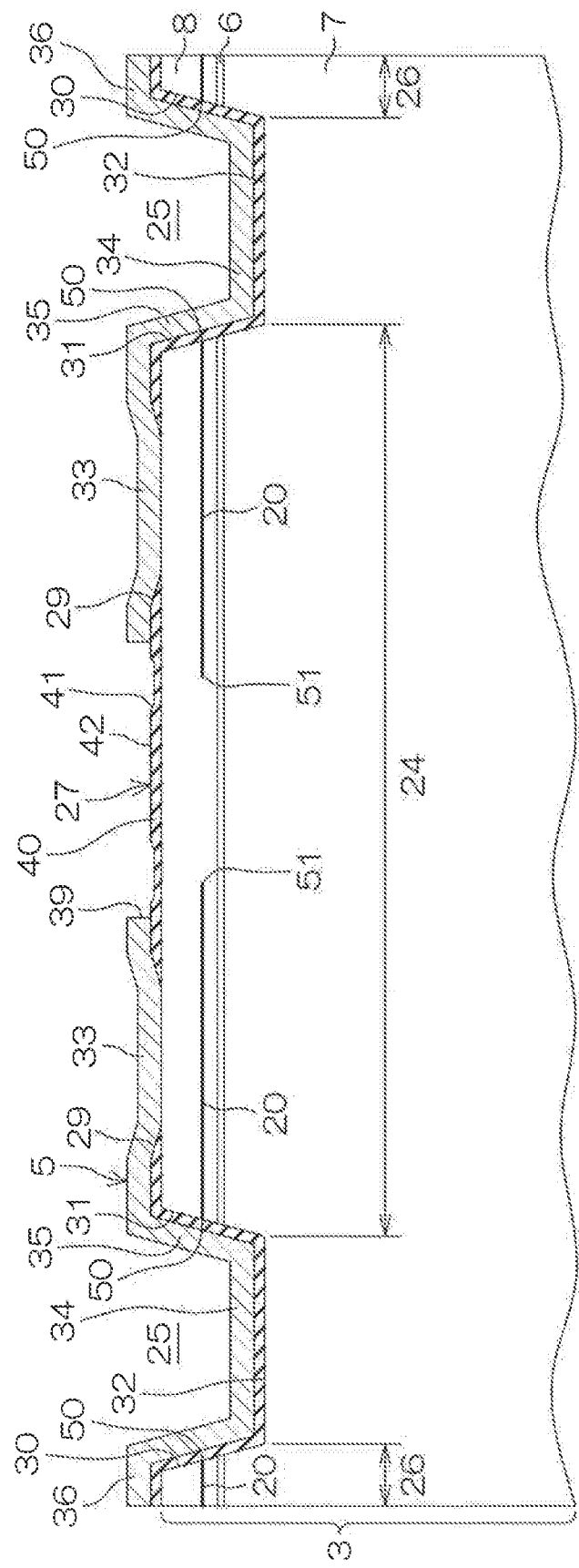
FIG. 12H is a view showing a step subsequent to that of FIG. 12G.

Thereafter, the p-side electrode 5 is selectively removed by, for example, dry etching as shown in FIG. 12H. Hence, the opening 39 for laser oscillation is formed in the p-side electrode 5.

Thereafter, the n-side electrode 4 (not shown) is formed on the rear surface of the substrate 2 by, for example, the vapor deposition method. A wafer is cut along a dicing line that is predetermined on the wafer, and, as a result, individual surface-emitting semiconductor lasers 1 are obtained.

FIG. 13 to FIG. 18 are views showing modifications of the surface-emitting semiconductor laser 1. The modifications of the surface-emitting semiconductor laser 1 will be described with reference to FIG. 13 to FIG. 18.

Figure 13:
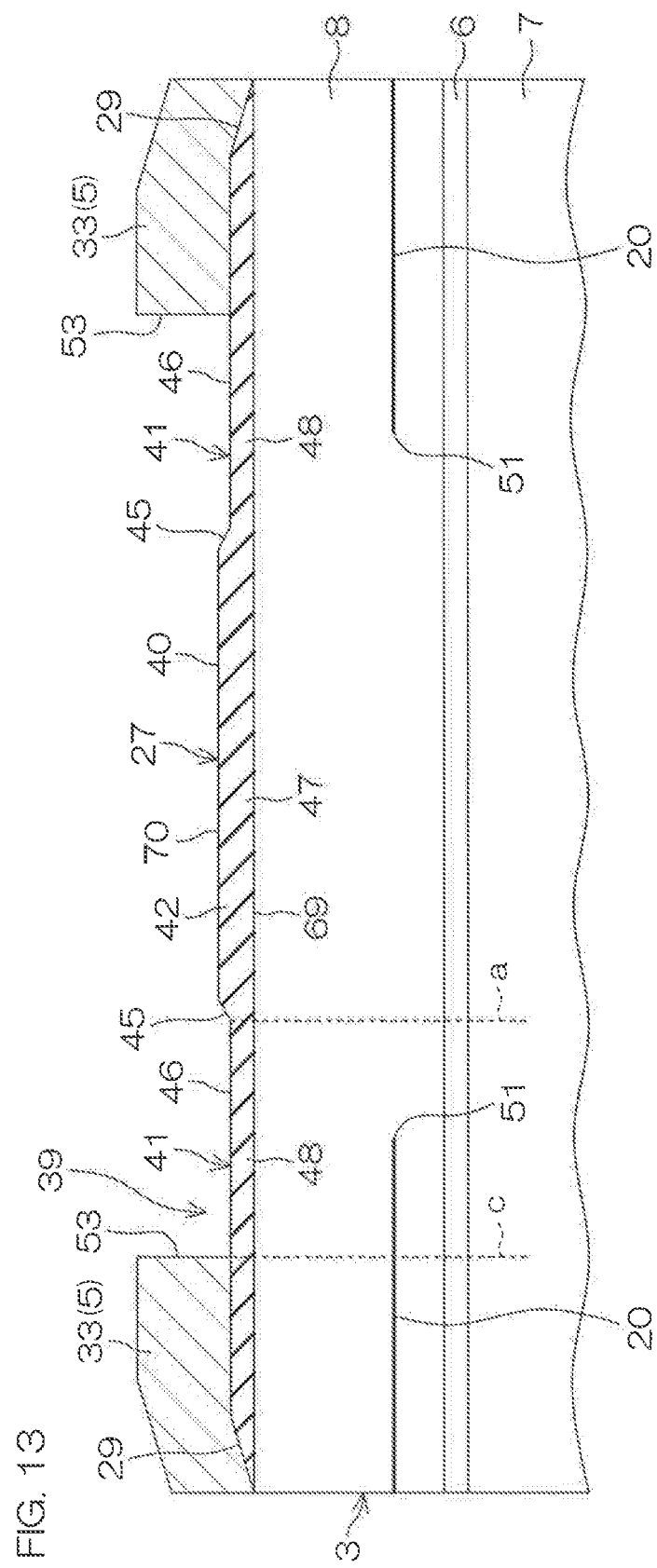
FIG. 13 is a view showing a modification of the surface-emitting semiconductor laser.

First, the concave portion 41 of the surface insulating film 27 may be formed in such a way as to spread to an end surface of the opening 39 for laser oscillation as shown in FIG. 13 although the outside of the concave portion 41 is defined by the second convex portion 43 in FIG. 8. Hence, the concave portion 41 may include the first side surface 45 formed of the first convex portion 42 and a second side surface 53 formed of the end surface of the opening 39 for laser oscillation.

Figure 14:
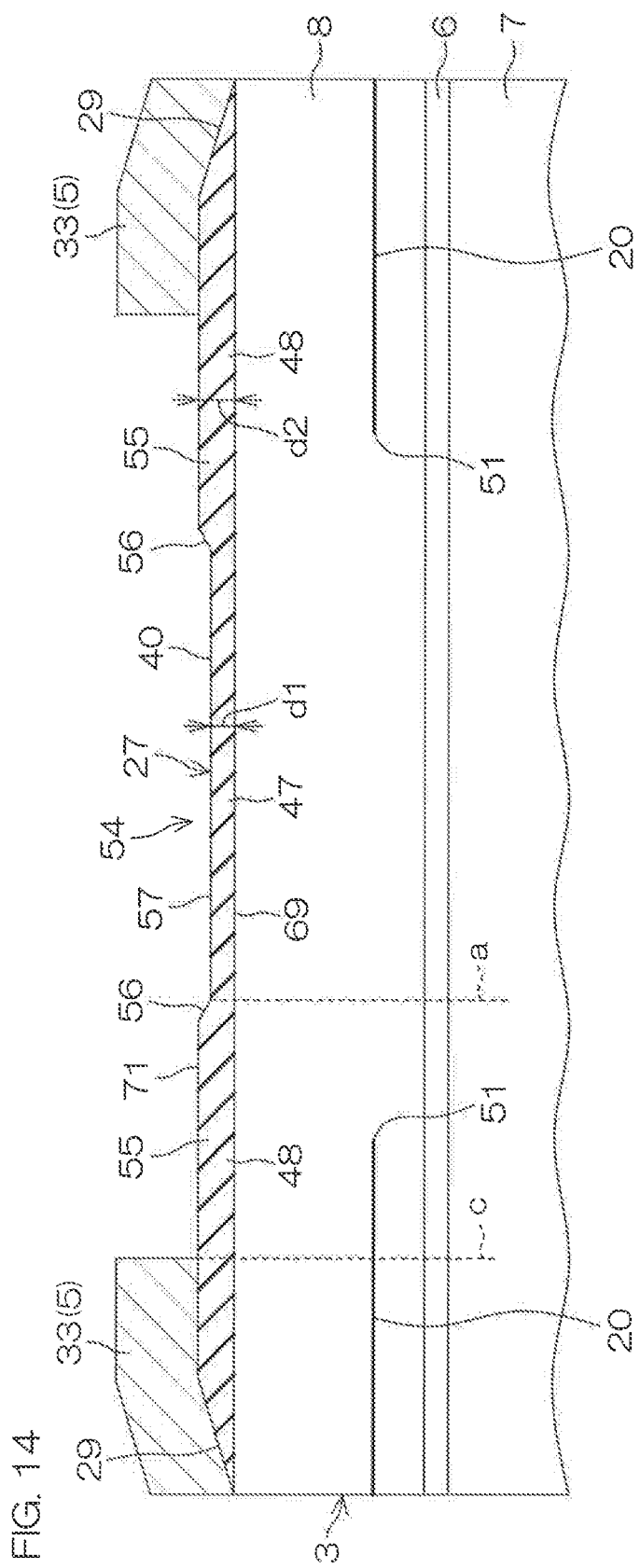
FIG. 14 is a view showing a modification of the surface-emitting semiconductor laser.

Next, a film thickness difference between the first portion 47 and the second portion 48 of the surface insulating film 27 may be provided by selectively forming a dotted concave portion 54 at the central portion of the exposed portion 40 of the surface insulating film 27 as shown in FIG. 14. The first portion 47 is formed of a bottom surface portion of the concave portion 54, and the second portion 48 is formed of an annular convex portion 55 surrounding the dotted concave portion 54 and a part directly under the convex portion 55. In this case, in the same way as above, the thickness d1 of the first portion 47 (distance from the rear surface 69 of the surface insulating film 27 to a bottom surface 57 of the concave portion 54) is set so that the first optical thickness becomes $(n+1)\lambda/2$ (n: integers) with respect to the emission wavelength $\lambda$, and the thickness d2 of the second portion 48 (distance from the rear surface 69 of the surface insulating film 27 to a surface 71 of the convex portion 55) is set so that the first optical thickness becomes $(2n+1)\lambda/4$ (n: integers) with respect to the emission wavelength A, and, when a comparison is drawn between the physical thicknesses d1 and d2, the magnitude relation therebetween is as follows: Thickness d1 of First portion 47<Thickness d2 of Second portion 48. Additionally, an inner side surface 56 of the concave portion 54 may be an inclined surface that inclines with respect to the bottom surface 57. Hence, the concave portion 54 may have a tapered shape whose width becomes smaller toward the bottom surface 46 in a cross-sectional view.

Figure 15:
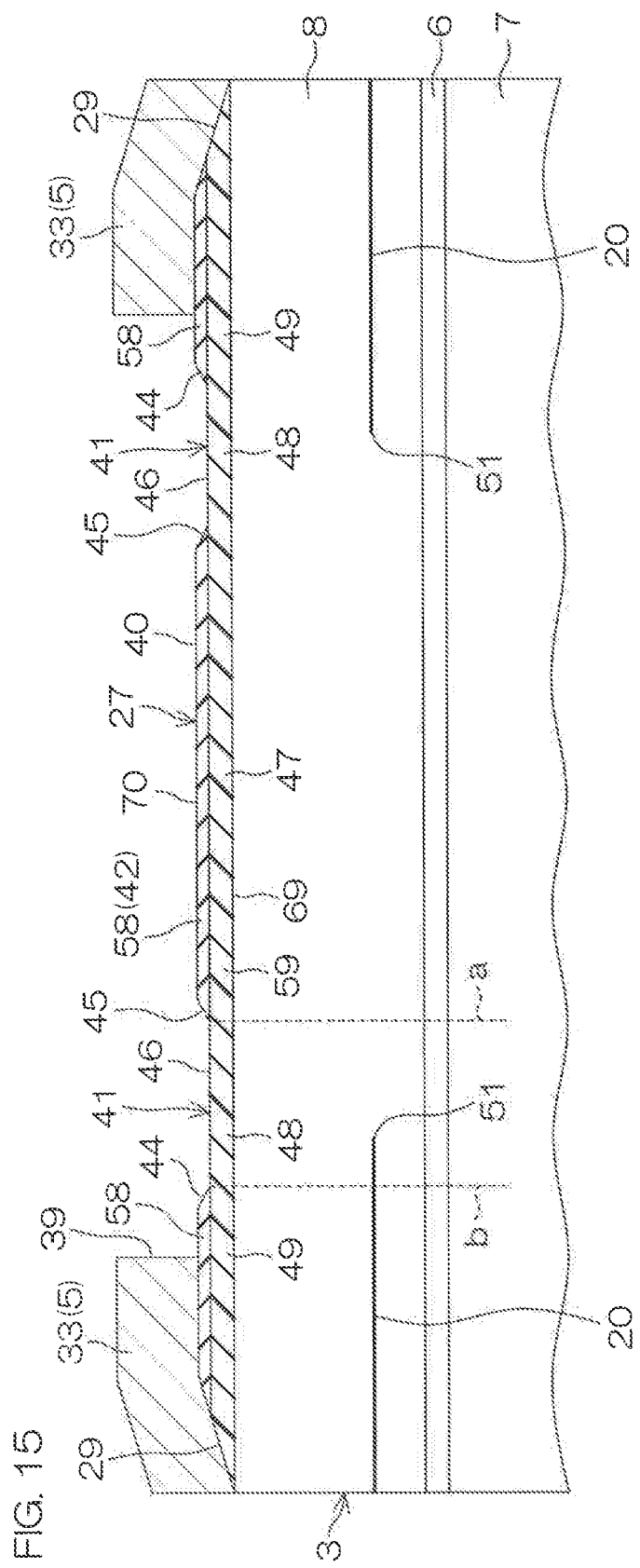
FIG. 15 is a view showing a modification of the surface-emitting semiconductor laser.

Next, the surface insulating film 27 may be formed of a multilayer film that includes a first material layer 58 forming the first convex portion 42 and a second material layer 59 that is made of a material differing from that of the first material layer 58 and that forms a lower portion of the first convex portion 42 as shown in FIG. 15 although the surface insulating film 27 is formed of a monolayer film made of a single material in FIG. 8. In this case, one of the first material layer 58 and the second material layer 59 may be formed of a silicon oxide ($SiO_2$) film, and the other one may be formed of a silicon nitride (SiN) film. If the surface insulating film 27 is a multilayer film, it is possible to secure an etching selection ratio between the first material layer 58 and the second material layer 59. Therefore, for example, when the concave portion 41 is formed at the surface insulating film 27 (see FIG. 12E), it is possible to easily provide a film thickness difference between the first portion 47 and the second portion 48 of the surface insulating film 27 by means of etching.

Figure 16:
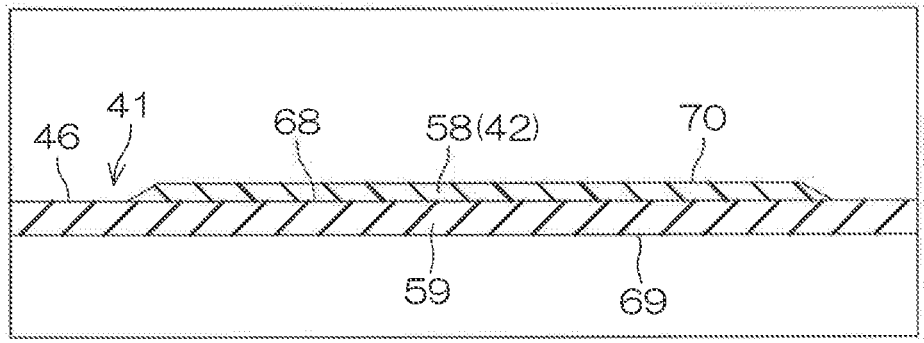
FIG. 16 is a view showing a modification of the surface-emitting semiconductor laser.
Figure 17:
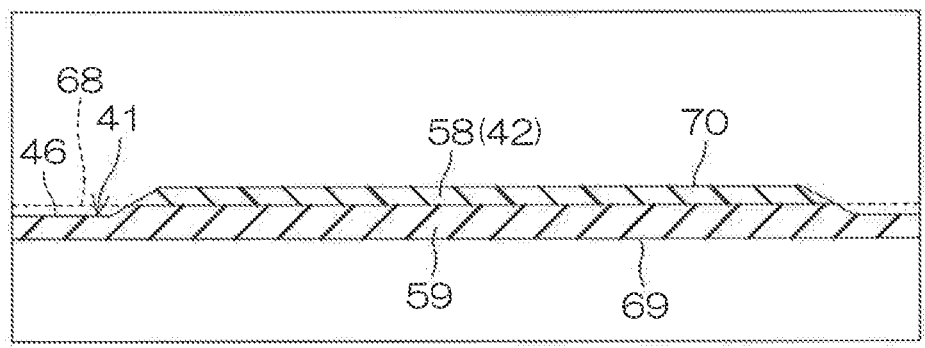
FIG. 17 is a view showing a modification of the surface-emitting semiconductor laser.

Additionally, an interface 68 between the first material layer 58 and the second material layer 59 may be placed at a height position of the bottom surface 46 of the concave portion 41 as shown in FIG. 16, or may be placed at a halfway portion in the thickness direction of the first convex portion 42 as shown in FIG. 17.

Figure 18:
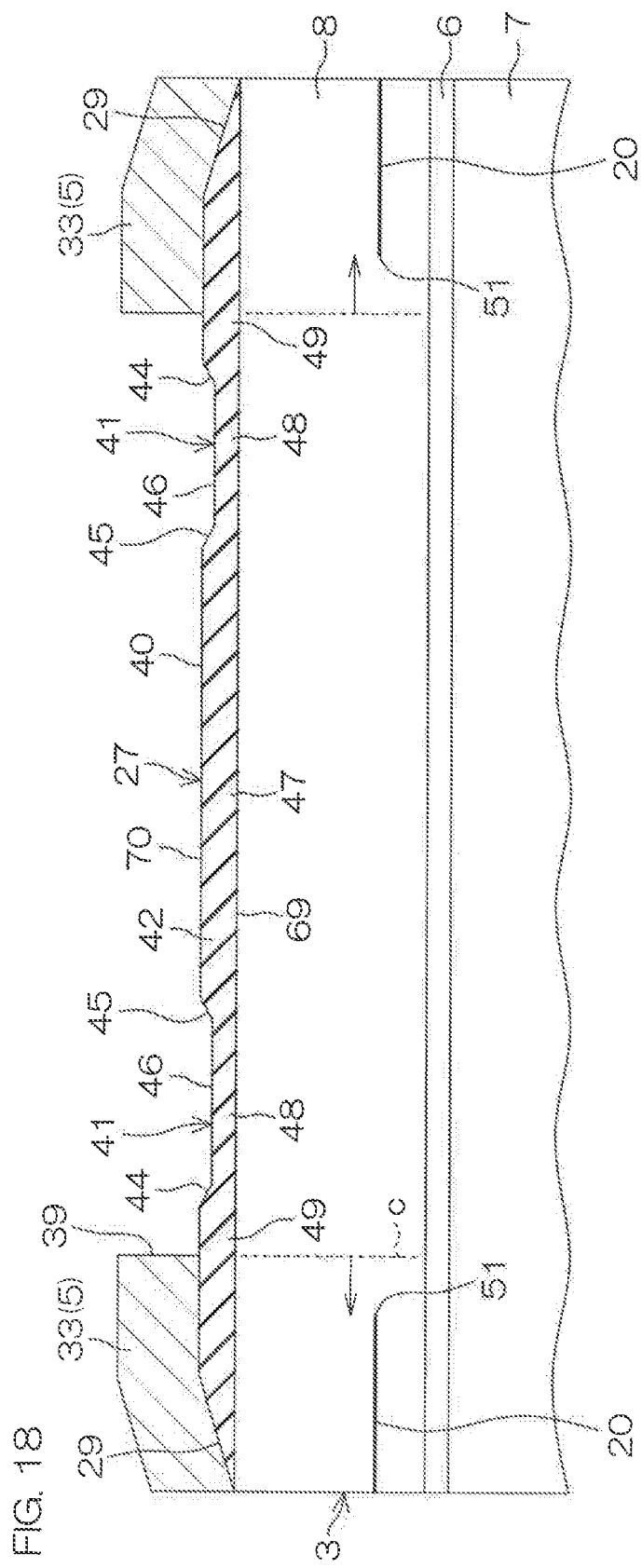
FIG. 18 is a view showing a modification of the surface-emitting semiconductor laser.

Next, the current constriction layer 20 may be formed so as to recede more outwardly than the opening 39 for laser oscillation (more outwardly than a supplementary line c that is an extension of a lower end of the opening 39) and so as to further surround the opening 39 for laser oscillation as shown in FIG. 18 although the inner peripheral edge 51 of the current constriction layer 20 is formed along the annular concave portion 41 in the region directly under the annular concave portion 41 in FIG. 8.

Figure 19:
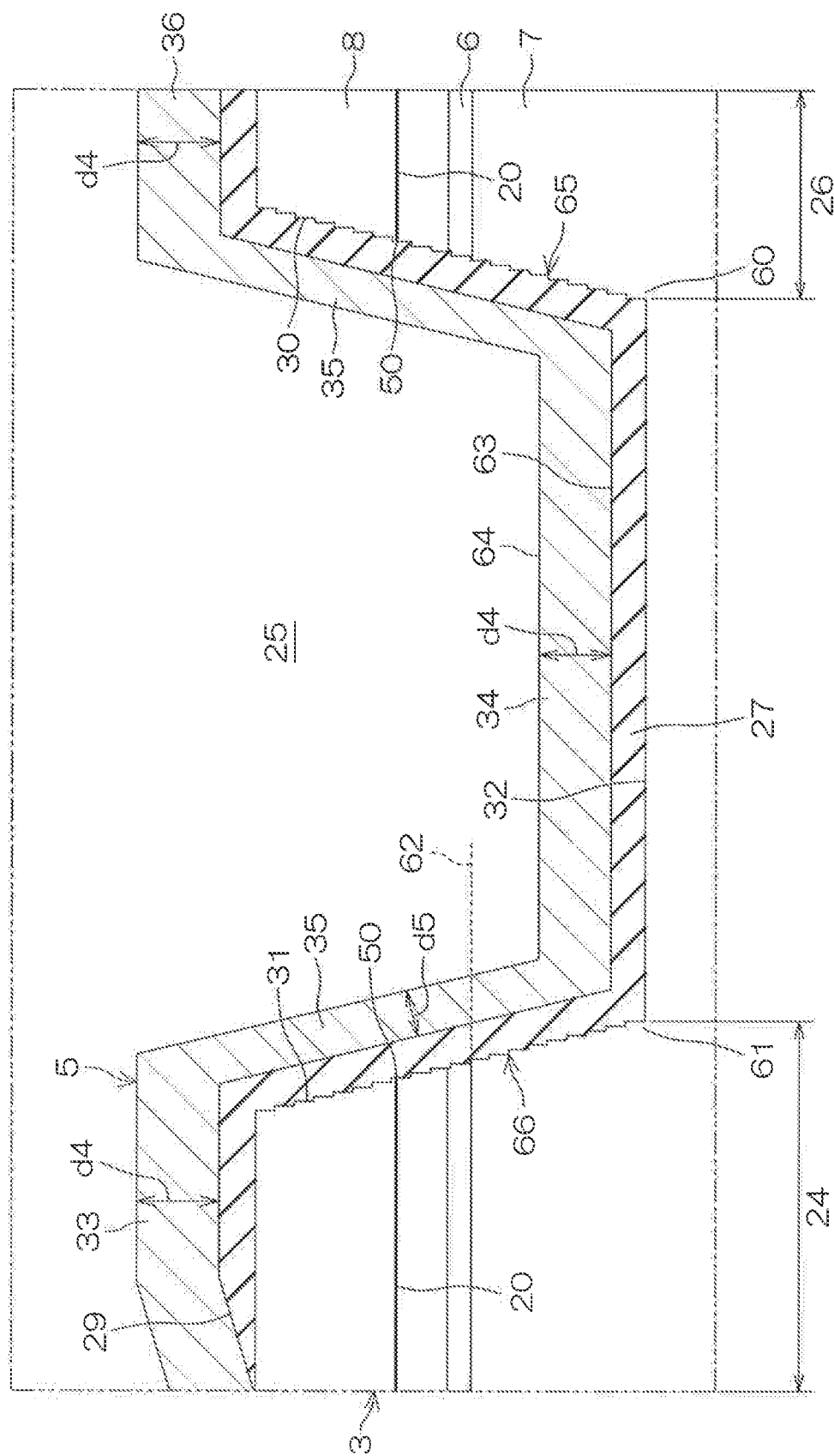
FIG. 19 is an enlarged view of a part surrounded by an alternate long and two short dashed line XIX of FIG. 7.
Figure 20:
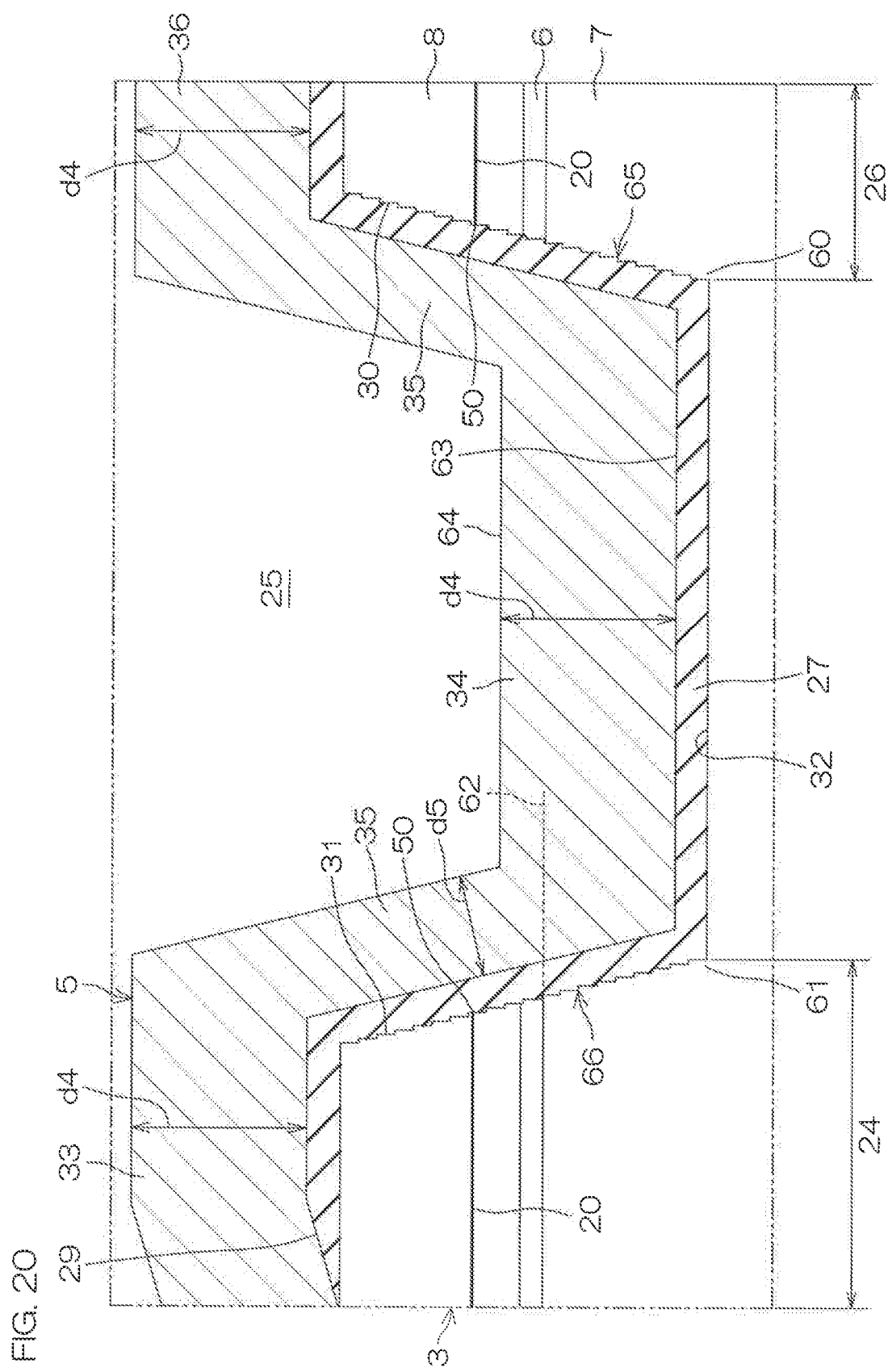
FIG. 20 is a view showing a modification of the surface-emitting semiconductor laser.
Figure 21:
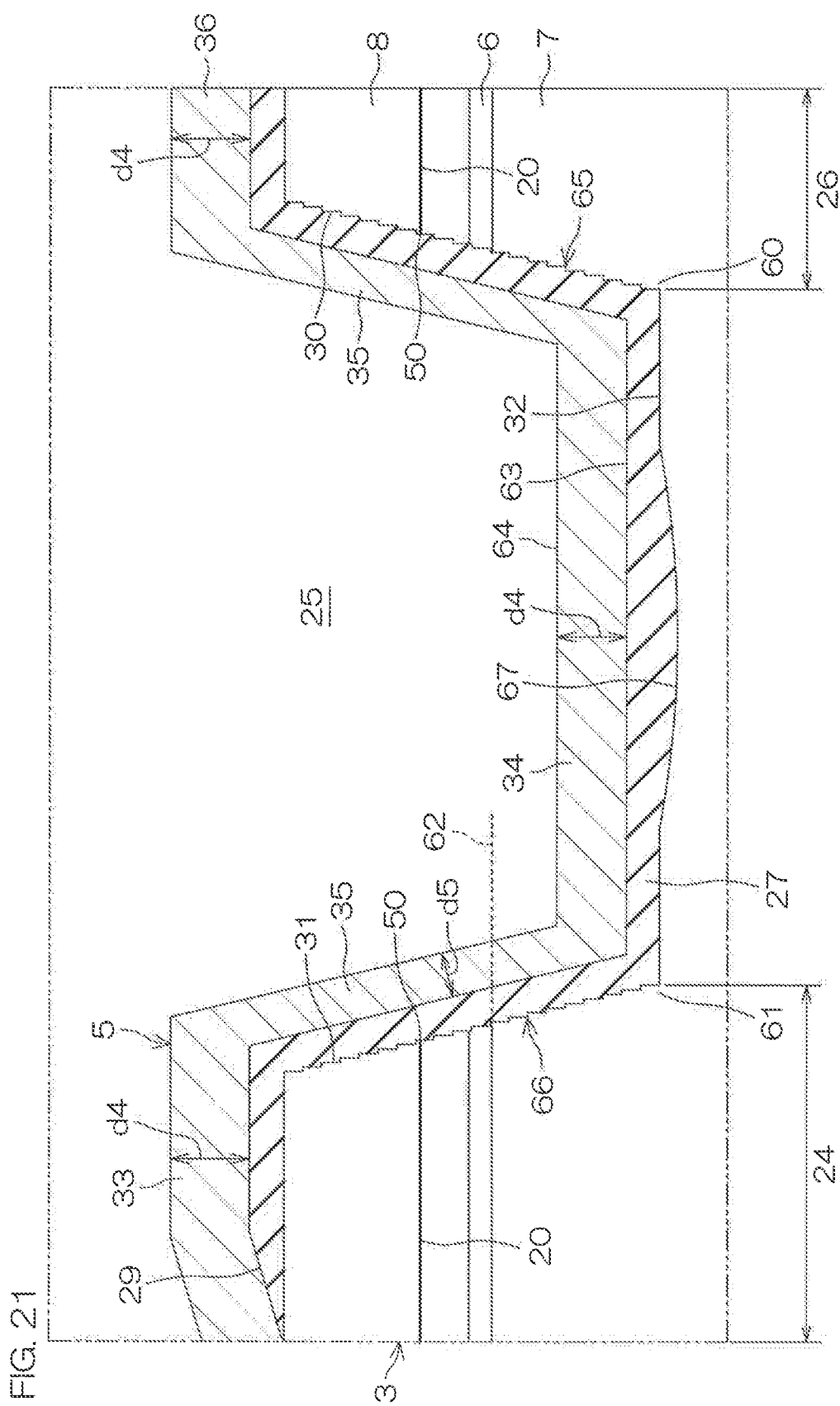
FIG. 21 is a view showing a modification of the surface-emitting semiconductor laser.

FIG. 19 is an enlarged view of a part surrounded by an alternate long and two short dashed line XIX of FIG. 7. FIG. 20 and FIG. 21 are views showing modifications of the surface-emitting semiconductor laser 1 relative to the configuration of FIG. 19.

Next, a structure of the trench 25 forming the mesa structure portion 24 will be described in more detail with reference to FIG. 19 to FIG. 21.

As described above, the annular trench 25 of the semiconductor laminated structure 3 is formed by selectively removing the p type semiconductor layer 8, the active layer 6, and a part of the n type semiconductor layer 7 by dry etching (see FIG. 12B). Hence, the trench 25 has a wall surface (the second side surface 30 and the first side surface 31) that straddles among the n type semiconductor layer 7, the active layer 6, and the p type semiconductor layer 8, and is dug more downwardly than the active layer 6 toward the n type-semiconductor-layer-7 side.

As thus described, the trench 25 is dug more downwardly than an interface 62 between the n type semiconductor layer 7 and the active layer 6, thus making it possible to relax stress applied on to the active layer 6 because a lower portion 60 or 61, at which thermal stress is liable to concentrate, of the wall surface of the trench 25 (the second side surface 30 and the first side surface 31) or the bottom surface 32, at which thermal stress is liable to concentrate, of the concave portion is not the active layer 6, for example, even if the thermal stress occurs, which results from a difference in the linear expansion coefficient between the semiconductor layer forming the semiconductor laminated structure 3 and a metal layer such as the p-side electrode 5. As a result, it is possible to restrain the breakage of the active layer 6 caused by stress, and therefore it is possible to improve the reliability of the surface-emitting semiconductor laser 1.

Additionally, in the p-side electrode 5, the contact portion 33, the bottom surface portion 34, and the field portion 36 that are parallel to the substrate surface are formed more thickly than the side surface portion 35 that is perpendicular to or is tilted with respect to the substrate surface. This is caused by the fact that a metallic material is bonded in the vertical direction from above the semiconductor laminated structure 3 when the p-side electrode 5 is formed. For example, the thickness of the p-side electrode 5 may be 0.1 µm to 0.3 µm, and, more specifically, the thickness d4 of the contact portion 33, the thickness d4 of the bottom surface portion 34, and the thickness d4 of the field portion 36 may be each 0.1 µm to 0.6 µm, and the thickness d5 of the side surface portion 35 may be 0.1 µm to 0.6 µm. The p-side electrode 5 is formed relatively thin in this way, and, as a result, an upper surface 64 of the bottom surface portion 34 of the p-side electrode 5, in addition to an upper surface 63 of the surface insulating film 27 on the bottom surface 32 of the trench 25, is placed at a height position lower than the interface 62 between the n type semiconductor layer 7 and the active layer 6 in FIG. 19.

Even if the semiconductor laminated structure 3 is warped by thermal stress because of the thus formed arrangement, and, accordingly, warpage occurs in a part parallel to the surface insulating film 27 and parallel to the substrate surface of the p-side electrode 5, which exists on the bottom surface 32 of the trench 25, it is possible to reduce influence exerted on the active layer 6 by the warpage of the part parallel to the surface insulating film 27 and parallel to the substrate surface of the p-side electrode 5 because the warped part is not adjacent to the active layer 6.

On the other hand, the p-side electrode 5 is integrally formed on the entirety of the surface of the semiconductor laminated structure 3, and therefore there is a concern that, in the field portion 36, shock resistance in wire bonding junction will be reduced or dissipation capability of heat generated in the mesa structure portion 24 will be reduced.

However, as described above, the metal layer 37 for wire bonding and the metal layer 38 for heat dissipation are formed on the field portion 36 of the p-side electrode 5 in the present preferred embodiment. Hence, it is possible to secure strength to withstand a force (for example, vibrations etc., caused by ultrasonic waves) generated in wire bonding junction by selectively thickly forming the metal layer 37 for wire bonding even when the entirety of the p-side electrode 5 is comparatively thinly formed in order not to allow the bottom surface portion 34 of the p-side electrode 5 to be adjacent to the active layer 6. As a result, it is possible to reduce the possibility that the field structure portion 26 will be shocked and broken, and therefore it is possible to improve the reliability of the surface-emitting semiconductor laser 1. Additionally, it is possible to increase the surface area of the metal layer 38 that contributes to heat dissipation by selectively thickly forming the metal layer 38 for heat dissipation. As a result, it is possible to improve the heat dissipation capability of the surface-emitting semiconductor laser 1.

Additionally, because of surface roughening that is generated by dry etching, uneven structures 65 and 66 are formed over the in-plane entirety at the second side surface 30 and the first side surface 31 of the trench 25 as shown in FIG. 19. The surface insulating film 27 is formed in such a way as to enter these uneven structures 65 and 66.

The thus formed arrangement makes it possible to increase the contact area between the wall surface of the trench 25 (the second side surface 30 and the first side surface 31) and the surface insulating film 27, and makes it possible to increase the friction force of the surface insulating film 27 against the second side surface 30 and the first side surface 31. This makes it possible to improve adhesive properties of the surface insulating film 27 with respect to the wall surface of the trench 25 (the second side surface 30 and the first side surface 31), and makes it possible to reduce the possibility that the surface insulating film 27 will peel off. As a result, it is possible to improve the reliability of the surface-emitting semiconductor laser 1.

On the other hand, the bottom surface portion 34 of the p-side electrode 5 (part parallel to the substrate surface) may be formed so as to become adjacent to the active layer 6 by forming the p-side electrode 5 thicker than that of FIG. 19 as shown in FIG. 20. In other words, the upper surface 64 of the bottom surface portion 34 of the p-side electrode 5 may be placed at a height position higher than the interface 62 between the n type semiconductor layer 7 and the active layer 6.

According to this arrangement, it is possible to efficiently dissipate heat generated in the active layer 6 because of the fact that the bottom surface portion 34 is adjacent to the active layer 6 although the reduction effect of influence exerted by the warpage of the bottom surface portion 34 (part parallel to the substrate surface) of the p-side electrode 5 becomes smaller than the arrangement of FIG. 19. As a result, it is possible to reduce the possibility that the active layer 6 will be thermally broken, and therefore it is possible to improve the reliability of the surface-emitting semiconductor laser 1.

Additionally, a concave portion 67 that is selectively concaved in a central portion away from the lower portions 60 and 61 of the wall surface (the second side surface 30 and the first side surface 31) of the trench 25 may be formed at the bottom surface 32 of the trench 25 as shown in FIG. 21. This concave portion 67 is generated by the fact that the etching rate of a central portion of an etching region is faster than the etching rate of a peripheral edge portion (part at which the second side surface 30 and the first side surface 31 are formed) of the etching region when the trench 25 is formed by etching.

According to this arrangement, it is possible to reduce the thickness of the n type semiconductor layer 7 directly under the bottom surface 32 of the trench 25, and therefore it is possible to relax stress applied to the n type semiconductor layer 7.

Figure 22:
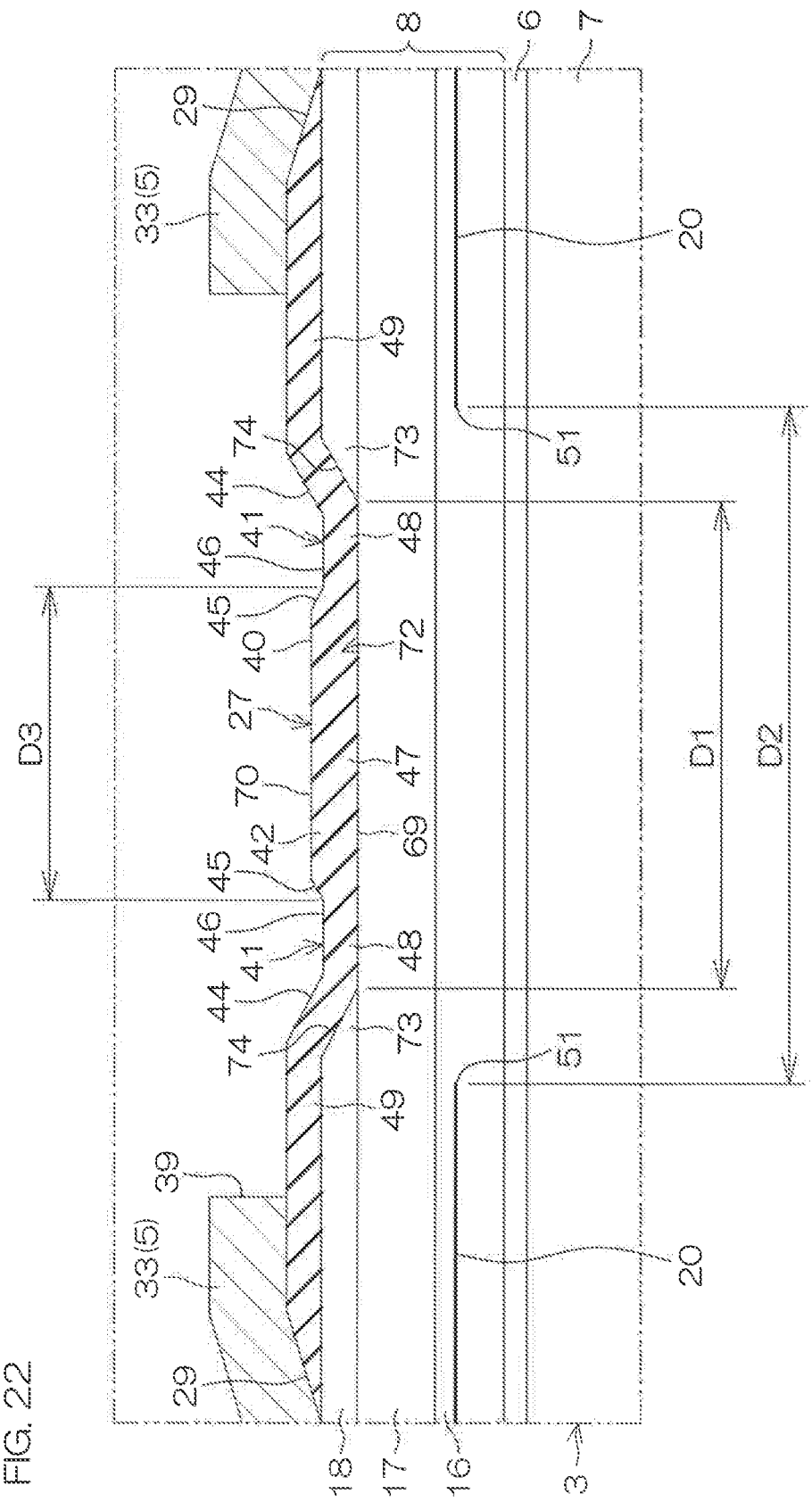
FIG. 22 is a view showing a modification of the surface-emitting semiconductor laser.

Additionally, an opening 72 may be formed in the p type contact layer 18 of the p type semiconductor layer 8 as shown in FIG. 22. A part of the surface insulating film 27 may be connected to the p type DBR layer 17 through the opening 72 of the p type contact layer 18. Additionally, the opening 72 has a side surface 74 that inclines with respect to the surface of the p type semiconductor layer 8.

The diameter D1 of the opening 72 may be smaller than the diameter D2 of the current constriction layer 20, and may be larger than the diameter D3 of the first convex portion 42 of the surface insulating film 27. In other words, the following relation may be satisfied: Diameter D2<Diameter D1<Diameter D3.

Hence, the p type contact layer 18 has a first portion 73 that bulges out more inwardly than the inner peripheral edge 51 of the current constriction layer 20. In the present preferred embodiment, the current constriction layer 20 is annularly formed, and therefore the first portion 73 of the p type contact layer 18 is also formed annularly in the same way as above. Additionally, the concave portion 41 of the surface insulating film 27 may be formed in an inward region of the opening 72.

According to this arrangement, the opening 72 is formed in the p type contact layer 18, and therefore it is possible to prevent basic-mode light from being absorbed by the p type contact layer 18. On the other hand, it is possible for the first portion 73 of the p type contact layer 18 to absorb (i.e., cut off) light that passes through the vicinity of the inner peripheral edge 51 of the current constriction layer 20 in which higher-order mode optical output is liable to become comparatively large. Moreover, the formation of the opening 72 makes it possible to prevent basic-mode light from being absorbed, and therefore it is possible to design the thickness of the p type contact layer 18 in accordance with the amount of higher-order mode light expected to be absorbed by the first portion 73. For example, if the opening 72 is formed, the thickness of the p type contact layer 18 may be 0.01 μm to 0.5 μm although the thickness of the p type contact layer 18 in which the opening 72 is not formed may be 0.02 μm to 0.08 μm as mentioned above.

Additionally, the formation of the opening 72 makes it possible to absorb higher-order mode light, and makes it possible to prevent basic-mode light from being absorbed, and therefore a film thickness difference is not required to be provided between the first portion 47 and the second portion 48 of the surface insulating film 27.

Figure 23:
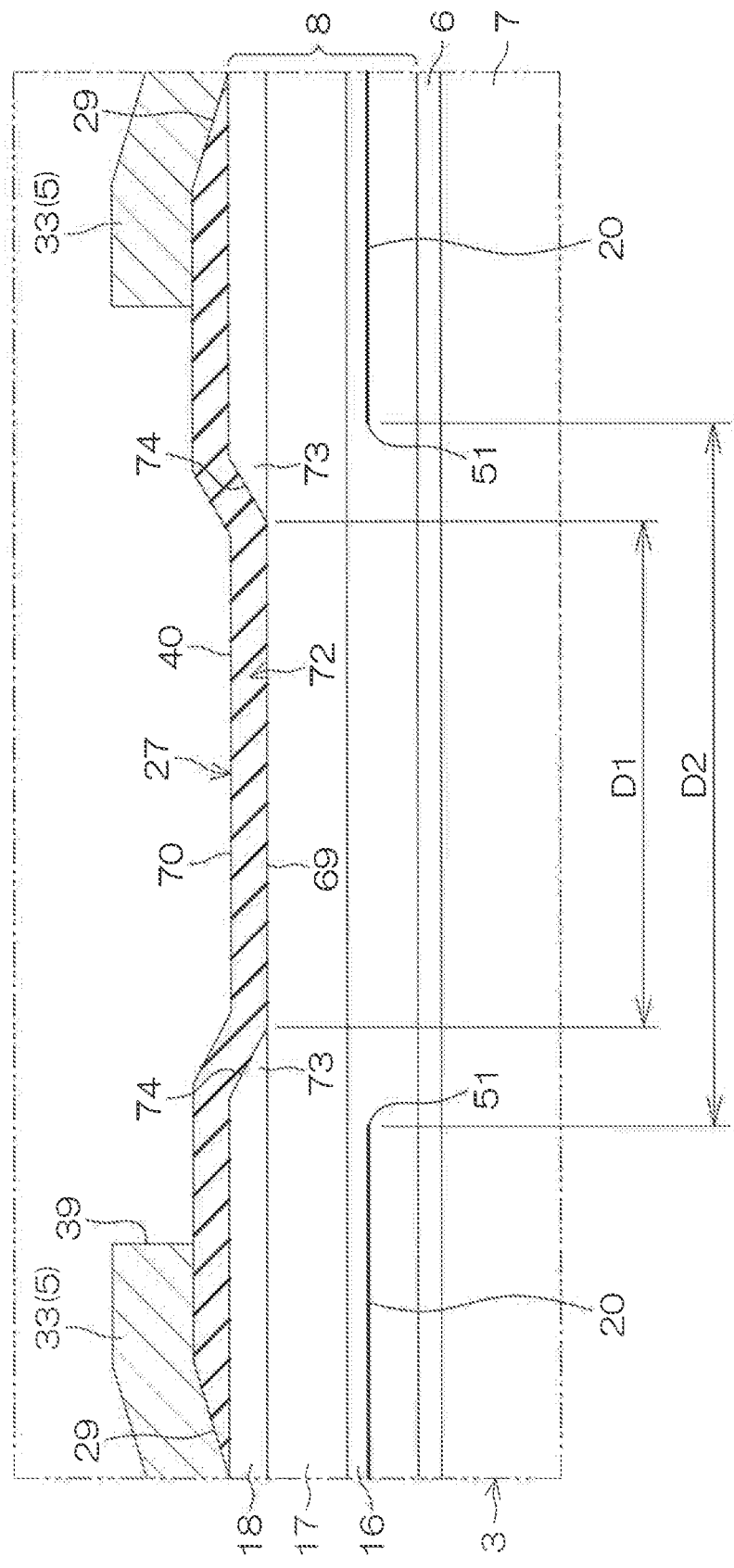
FIG. 23 is a view showing a modification of the surface-emitting semiconductor laser.

For example, the surface insulating film 27 may have a flat surface (in other words, the first convex portion 42 is not necessarily required to be formed) in a region on the opening 72 of the p type contact layer 18 as shown in FIG. 23.

The present invention can be embodied in other modes although the preferred embodiment of the present invention has been described as above.

For example, the aforementioned surface-emitting semiconductor laser 1 is usable for the use of optical sensors, laser printers, or the like.

Additionally, a configuration in which the conductivity type of each semiconductor part of the surface-emitting semiconductor laser 1 is reversed may be employed. In other words, the p type part may be n type, and the n type part may be p type in the surface-emitting semiconductor laser 1.

Additionally, the composition of each of the n type semiconductor layer 7, the active layer 6, and the p type semiconductor layer 8 mentioned above is merely one example among many compositions, and can be changed within a range in which laser oscillation perpendicular to the substrate surface can be performed.

Besides, various design changes can be made in the scope of the matter as defined by the appended claims.

From the contents of the aforementioned preferred embodiment, the following features can be extracted besides the invention described in the appended claims.

(Item 1)

A surface-emitting semiconductor laser that includes a first-conductivity-type layer including a first-conductivity-type DBR (Distributed Bragg Reflector) layer, an active layer formed on the first-conductivity-type layer, a second-conductivity-type layer that is formed on the active layer and that includes a second-conductivity-type DBR (Distributed Bragg Reflector) layer, a concave portion that has a wall surface straddling among the first-conductivity-type layer, the active layer, and the second-conductivity-type layer and that is dug more downwardly than the active layer toward a side of the first-conductivity-type layer, an insulating layer formed along a top portion of the second-conductivity-type layer, the wall surface, and a bottom surface of the concave portion, and a metal layer formed so as to cover the insulating layer.

According to this arrangement, it is possible to relax stress applied onto the active layer because the lower portion, at which thermal stress is liable to concentrate, of the wall surface of the concave portion or the bottom surface portion, at which thermal stress is liable to concentrate, of the concave portion is not the active layer, for example, even if the thermal stress occurs, which results from a difference in the linear expansion coefficient between the semiconductor layer, which includes the first-conductivity-type layer, the active layer, and the second-conductivity-type layer, and the metal layer. As a result, it is possible to restrain the breakage of the active layer caused by stress, and therefore it is possible to improve the reliability of the surface-emitting semiconductor laser.

(Item 2)

The surface-emitting semiconductor laser according to Item 1 wherein a part of the insulating layer disposed on the bottom surface of the concave portion is formed with a thickness in which an upper surface of the part is placed at a height position lower than an interface between the first-conductivity-type layer and the active layer.

According to this arrangement, even if the semiconductor layer is warped by thermal stress, and, accordingly, warpage occurs in the part of the insulating layer on the bottom surface of the concave portion, it is possible to reduce influence exerted on the active layer by the warpage of the insulating layer because the part of the insulating layer is not adjacent to the active layer.

(Item 3)

The surface-emitting semiconductor laser according to Item 2, wherein a part of the metal layer disposed on the bottom surface of the concave portion is formed with a thickness in which an upper surface of the part is placed at a height position lower than the interface between the first-conductivity-type layer and the active layer.

According to this arrangement, even if the semiconductor layer is warped by thermal stress, and, accordingly, warpage occurs in the part of the metal layer on the bottom surface of the concave portion, it is possible to reduce influence exerted on the active layer by the warpage of the metal layer because the part of the metal layer is not adjacent to the active layer.

(Item 4)

The surface-emitting semiconductor laser according to Item 1 or Item 2, wherein a part of the metal layer disposed on the bottom surface of the concave portion is formed so as to be adjacent to the active layer.

According to this arrangement, it is possible to efficiently dissipate heat generated in the active layer because of the fact that the metal layer is adjacent to the active layer although the reduction effect of influence exerted by the warpage of the metal layer becomes smaller than Item 3. As a result, it is possible to reduce the possibility that the active layer will be thermally broken, and therefore it is possible to improve the reliability of the surface-emitting semiconductor laser.

(Item 5)

The surface-emitting semiconductor laser according to Item 3, wherein the concave portion is formed in an annular shape that surrounds a mesa structure portion consisting of the first-conductivity-type layer, the active layer, and the second-conductivity-type layer, and, in the mesa structure portion, the metal layer is electrically connected to the second-conductivity-type layer through the insulating layer, and has an opening for laser oscillation by which a part of the insulating layer is exposed.

(Item 6)

The surface-emitting semiconductor laser according to Item 5, wherein a field region formed of a laminated structure portion consisting of the first-conductivity-type layer, the active layer, and the second-conductivity-type layer that are not used for laser oscillation is formed outside the concave portion, the surface-emitting semiconductor laser further including, in the field region, a second metal layer for wire bonding that is formed on the metal layer and that has a thickness greater than the metal layer.

According to this arrangement, it is possible to secure strength to withstand a force (for example, vibrations etc., caused by ultrasonic waves) generated in wire bonding junction by selectively thickly forming the second metal layer for wire bonding even when the entirety of the metal layer is comparatively thinly formed in order not to allow the part of the metal layer disposed on the bottom surface of the concave portion to become adjacent to the active layer. As a result, it is possible to reduce the possibility that the field region will be shocked and broken, and therefore it is possible to improve the reliability of the surface-emitting semiconductor laser.

(Item 7)

The surface-emitting semiconductor laser according to Item 6, wherein the metal layer has a thickness of 0.1 µm to 0.3 µm, and the second metal layer has a thickness of 2 µm to 4 µm.

(Item 8)

The surface-emitting semiconductor laser according to Item 6, further including, in the field region, a third metal layer for heat dissipation that is formed on the metal layer and that has a thickness greater than the metal layer.

According to this arrangement, it is possible to increase the surface area of the metal layer by selectively thickly forming the third metal layer for heat dissipation even when the entirety of the metal layer is comparatively thinly formed in order not to allow the part of the metal layer disposed on the bottom surface of the concave portion to become adjacent to the active layer. As a result, it is possible to improve the heat dissipation capability of the surface-emitting semiconductor laser.

(Item 9)

The surface-emitting semiconductor laser according to Item 8, wherein the metal layer has a thickness of 0.1 µm to 0.3 µm, and the third metal layer has a thickness of 2 µm to 4 µm.

(Item 10)

The surface-emitting semiconductor laser according to any one of Item 1 to Item 9, wherein the wall surface is an inclined surface that inclines with respect to the bottom surface of the concave portion, and an uneven structure is formed in a plane of the wall surface.

According to this arrangement, it is possible to increase the contact area between the wall surface of the concave portion and the insulating layer, and it is possible to increase the friction force of the insulating layer against the wall surface. This makes it possible to improve adhesive properties of the insulating layer with respect to the wall surface of the concave portion, and it is possible to reduce the possibility that the insulating layer will peel off. As a result, it is possible to improve the reliability of the surface-emitting semiconductor laser.

(Item 11)

The surface-emitting semiconductor laser according to any one of Item 1 to Item 10, wherein a second concave portion that is selectively concaved in a region away from a lower end portion of the wall surface is formed at the bottom surface of the concave portion.

According to this arrangement, it is possible to reduce the thickness of the first-conductivity-type layer directly under the bottom surface of the concave portion, and therefore it is possible to relax stress applied to the first-conductivity-type layer.

The present application corresponds to Japanese Patent Application No. 2017-210954 filed in the Japan Patent Office on Oct. 31, 2017 and Japanese Patent Application No. 2018-189369 filed in the Japan Patent Office on Oct. 4, 2018, and the entire disclosure of these applications is incorporated herein by reference.

REFERENCE SIGNS LIST

1 Surface-emitting semiconductor laser
2 Substrate
2A Long side
2B Short side
3 Semiconductor laminated structure
4 n-side electrode
5 p-side electrode
6 Active layer
7 n type semiconductor layer
8 p type semiconductor layer
10 n type DBR layer
17 p type DBR layer
19 p type layer
20 Current constriction layer
24 Mesa structure portion
25 Trench
26 Field structure portion
27 Surface insulating film
30 (Trench) Second side surface
31 (Trench) First side surface
32 (Trench) Bottom surface
34 (p-side electrode) Bottom surface portion
36 (p-side electrode) Field portion
37 Metal layer for wire bonding
38 Metal layer for heat dissipation
39 Opening for laser oscillation
40 Exposed portion
41 Concave portion
42 Convex portion
43 Second convex portion
44 (Concave portion) Second side surface
45 (Concave portion) First side surface
46 (Concave portion) Bottom surface
47 (Surface insulating film) First portion
48 (Surface insulating film) Second portion
49 (Surface insulating film) Third portion
51 (High-resistance region) Inner peripheral edge
53 (Concave portion) Second side surface
54 Concave portion
55 Convex portion
56 (Concave portion) Inner side surface
57 (Concave portion) Bottom surface
58 First material layer
59 Second material layer
60 (Trench) Lower portion
61 (Trench) Lower portion
62 Interface
63 (Surface insulating film) Upper surface
64 (p-side electrode) Upper surface
65 Uneven structure
66 Uneven structure
67 Concave portion

The invention claimed is:

1. A surface-emitting semiconductor laser comprising:
a semiconductor laminated structure that includes a first-conductivity-type layer, an active layer stacked on the first-conductivity-type layer, and a second-conductivity-type layer stacked on the active layer and in which light generated in the active layer is extracted as laser light from a side of the second-conductivity-type layer while resonating along a lamination direction of the first-conductivity-type layer, the active layer and the second-conductivity-type layer;
a current constriction layer that is formed closer to a side of the active layer than to a surface of the secondconductivity-type layer, and that is an annular insulative current constriction layer having an opening, and in which the active layer and the second-conductivity-type layer are electrically connected together through the opening, the current constriction layer having an inner peripheral edge which is a peripheral edge of the opening;

an insulating layer that is formed on the second-conductivity-type layer and that has translucency with respect to an emission wavelength of the active layer;

a first electrode electrically connected to the first-conductivity-type layer; and a second electrode that is formed on the insulating layer and that passes through the insulating layer and is electrically connected to the second-conductivity-type layer, wherein a part of the insulating layer between edges of the second electrode includes a first portion that has a first thickness and a second portion that has a second thickness to make output of light emitted from the active layer smaller than the first portion in comparison with the first thickness and that surrounds the first portion, the second-conductivity-type layer includes a second-conductivity-type DBR (Distributed Bragg Reflector) layer and a second-conductivity-type contact layer formed on the second-conductivity-type DBR layer, the second-conductivity-type contact layer having an opening from which a part of the second-conductivity-type DBR layer is exposed, the insulating layer between the edges of the second electrode includes an annular concave portion and a first convex portion surrounded by the annular concave portion, the first thickness of the insulating layer is a thickness from a rear surface of the insulating layer to a surface of the first convex portion, and the second thickness of the insulating layer is a thickness from the rear surface of the insulating layer to a bottom surface of the annular concave portion, a part of the insulating layer is connected to the second-conductivity-type DBR layer through the opening of the second-conductivity-type contact layer, a diameter of the opening the second-conductivity-type contact layer is smaller than a diameter of the opening of the current constriction layer, the second-conductivity-type contact layer includes a first portion which is formed inside the opening from the inner peripheral edge of the current constriction layer in a cross-sectional view, and the first convex portion and the annular concave portion of the insulating layer are formed in an inward region of the opening of the current constriction layer.

2. The surface-emitting semiconductor laser according to claim 1, wherein the first-conductivity-type layer includes a first-conductivity-type DBR (Distributed Bragg Reflector) layer.

3. The surface-emitting semiconductor laser according to claim 1, wherein the part of the insulating layer between the edges of the second electrode further includes a second convex portion that surrounds the annular concave portion on an outer peripheral side of the annular concave portion, and the annular concave portion is defined between the first convex portion and the second convex portion, and an inner surface of the annular concave portion includes a first side surface formed of the first convex portion and a second side surface formed of the second convex portion.

4. The surface-emitting semiconductor laser according to claim 3, wherein the first side surface and the second side surface of the annular concave portion each include an inclined surface that inclines with respect to the surface of the second-conductivity-type layer so that the annular concave portion is formed in a tapered shape whose width becomes smaller toward the bottom surface of the annular concave portion in a cross-sectional view.

5. The surface-emitting semiconductor laser according to claim 1, wherein the second electrode has an opening for laser oscillation by which a part of the insulating layer is exposed, and the annular concave portion is formed so as to spread to an end surface of the opening for laser oscillation, and the inner surface of the annular concave portion includes a first side surface formed of the first convex portion and a second side surface formed of the end surface of the opening for laser oscillation.

6. The surface-emitting semiconductor laser according to claim 1, wherein the part of the insulating layer between the edges of the second electrode includes a dotted concave portion and an annular convex portion that surrounds the dotted concave portion, and the first thickness of the insulating layer includes a thickness from the rear surface of the insulating layer to a bottom surface of the dotted concave portion, and the second thickness of the insulating layer includes a thickness from the rear surface of the insulating layer to a surface of the annular convex portion.

7. The surface-emitting semiconductor laser according to claim 6, wherein a side surface of the dotted concave portion includes an inclined surface that inclines with respect to the surface of the second-conductivity-type layer so that the dotted concave portion is formed in a tapered shape whose width becomes smaller toward a bottom surface of the dotted concave portion in a cross-sectional view.

8. The surface-emitting semiconductor laser according to claim 6, wherein a circumferential edge of the opening of the current constriction layer is formed along the annular concave portion or along the annular convex portion in a plan view, and partially covers the annular concave portion or the annular convex portion from outside.

9. The surface-emitting semiconductor laser according to claim 1, wherein the insulating layer includes a monolayer film made of a single material.

10. The surface-emitting semiconductor laser according to claim 9, wherein the monolayer film consists of a silicon oxide ($SiO_2$) film or a silicon nitride (SiN) film.

11. The surface-emitting semiconductor laser according to claim 1, wherein the insulating layer includes a multilayer film that includes a first material layer forming the first convex portion and a second material layer that forms a lower portion of the first convex portion and that is made of a material differing from a material of the first material layer.

12. The surface-emitting semiconductor laser according to claim 11, wherein an interface between the first material layer and the second material layer is placed at a height position of the bottom surface of the annular concave portion.

13. The surface-emitting semiconductor laser according to claim 11, wherein an interface between the first material layer and the second material layer is placed at a halfway portion in a thickness direction of the first convex portion.

14. The surface-emitting semiconductor laser according to claim 11, wherein one of the first material layer and the second material layer consists of a silicon oxide ($SiO_2$) film, and another one of the first material layer and the second material layer consists of a silicon nitride (SiN) film.

15. The surface-emitting semiconductor laser according to claim 1, wherein the current constriction layer has a thickness of 15 nm to 50 nm.

16. The surface-emitting semiconductor laser according to claim 1, wherein the current constriction layer includes a selective oxidation layer in which a part of the semiconductor laminated structure is selectively oxidized along a direction perpendicular to the lamination direction.

17. The surface-emitting semiconductor laser according to claim 1, wherein the inner peripheral edge of the current constriction layer surrounds the first portion in a plan view.

18. The surface-emitting semiconductor laser according to claim 1, wherein a circumferential edge of the opening of the current constriction layer is formed along the annular concave portion or along the annular convex portion in a plan view, and partially covers the annular concave portion or the annular convex portion from outside.

19. The surface-emitting semiconductor laser according to claim 1, wherein the second electrode has an opening for laser oscillation by which a part of the insulating layer is exposed, and
 the inner peripheral edge of the current constriction layer is disposed outside an extension line drawn downward from a peripheral edge of the opening for laser oscillation in a cross-sectional view, and surrounds the opening for laser oscillation.

\* \* \* \* \*